(12) United States Patent
Inoue

(10) Patent No.: US 8,378,227 B2
(45) Date of Patent: Feb. 19, 2013

(54) METHOD OF FORMING WIRING BOARD AND WIRING BOARD OBTAINED

(75) Inventor: Seiichi Inoue, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 461 days.

(21) Appl. No.: 12/585,754

(22) Filed: Sep. 24, 2009

(65) Prior Publication Data

US 2010/0078208 A1    Apr. 1, 2010

(30) Foreign Application Priority Data

Sep. 30, 2008  (JP) ................................ 2008-252775

(51) Int. Cl.
*H05K 1/11*    (2006.01)
(52) U.S. Cl. ....................................... 174/261
(58) Field of Classification Search .......... 174/261, 174/254, 255, 260, 262; 257/734
See application file for complete search history.

(56) References Cited

U.S. PATENT DOCUMENTS

| | | | |
|---|---|---|---|
| 8,026,448 B2 * | 9/2011 | Tanaka ........................... | 174/255 |
| 2008/0193737 A1 * | 8/2008 | Uno et al. ..................... | 428/308.4 |
| 2008/0308305 A1 * | 12/2008 | Kawabe ........................ | 174/255 |
| 2008/0309581 A1 * | 12/2008 | Fujii et al. .................... | 343/873 |

FOREIGN PATENT DOCUMENTS

| | | |
|---|---|---|
| JP | 2003-224349 | 8/2003 |
| JP | 2003/318593 | 11/2003 |
| JP | 2004-207558 | 7/2004 |
| JP | 2006-026522 | 2/2006 |
| JP | 2006-108352 | 4/2006 |
| JP | 2007-027454 | 2/2007 |
| WO | WO/02/18080 | 3/2002 |

OTHER PUBLICATIONS

Machine Translation of JP 2004-207558 (Jul. 22, 2004).*

* cited by examiner

*Primary Examiner* — Jeremy Norris
*Assistant Examiner* — Tremesha S Willis
(74) *Attorney, Agent, or Firm* — Jean C. Edwards, Esq.; Edwards Neils PLLC

(57) ABSTRACT

A method of forming a wiring board comprises: a step of forming a receptive layer having a porous structure on a substrate; a step of forming wiring portions in a desired conductive pattern on a surface of the receptive layer by ejecting a colloidal metal solution for drawing by an ink-jet system based on image date of the conductive pattern; and a step of performing a migration-proof treatment on at least part of the receptive layer exposed between mutually adjacent wiring portions.

12 Claims, 8 Drawing Sheets

METHOD OF FORMING WIRING BOARD AND WIRING BOARD OBTAINED

CROSS REFERENCE TO RELATED APPLICATIONS

This application claims priority to Japanese Patent Application No. 2008-252775, filed Sep. 30, 2008, the contents of which are incorporated herein by reference in their entirety. In addition, the entire contents of all patents and references cited in this specification are also incorporated herein by reference.

BACKGROUND OF THE INVENTION

The present invention relates to a method of forming a wiring board and more specifically to a method of forming wiring on a printed wiring board.

The invention also relates to a wiring board obtained thereby.

Conventionally, the pattern on the conductor part (wiring part) of printed wiring boards (electronic circuit boards) has been formed by the subtractive, semi-additive and additive processes.

The subtractive process is a process in which unnecessary portions are removed from a metal layer formed on a substrate to form a pattern of a conductive part (wiring pattern), and the semi-additive and additive processes are processes in which a conductor part pattern is formed on a substrate.

In either process, the photolithographic technology has been employed to form the conductor part pattern.

The subtractive, semi-additive and additive processes are described below.

FIGS. 8A to 8F show a method of forming a pattern of a conductor part by the subtractive process.

According to the subtractive process, copper foil conductor layers 202 are formed on both surfaces of an insulating substrate 200 to obtain a copper clad laminate 204 as shown in FIG. 8A; then a through-hole 206 is formed in the copper clad laminate 204 as shown in FIG. 8B; thereafter a conductive metallic layer 208 covering the surfaces of the conductor layers 202 and the inner wall of the through-hole 206 is formed by electroless plating or electrolytic plating as shown in FIG. 8C.

Then, as shown in FIG. 8D, resist layers 210 are formed on the surfaces of the conductive metallic layer 208 on the conductor layers 202, and the resist layers 210 are selectively exposed using a photomask and developed to form the patterned resist layers 210.

Then, as shown in FIG. 8E, parts of the conductor layers 202 and the conductive metallic layer 208 which are not covered with the resist layers 210 are removed by etching, and as shown in FIG. 8F, the resist layers 210 are removed to form a printed wiring board.

Next, a method of forming a wiring pattern using the semi-additive process is shown in FIGS. 9A to 9G.

According to the semi-additive process, an insulating substrate 200 as shown in FIG. 9A is perforated to form a through-hole 206 as shown in FIG. 9B. Then, as shown in FIG. 9C, a conductive metallic layer 208 is formed by electroless plating on the surfaces of the insulating substrate 200 and the inner wall of the through-hole 206.

Then, as shown in FIG. 9D, resist layers 210 are formed on the surfaces of the conductive metallic layer 208, and the resist layers 210 are selectively exposed using a photomask and developed to form the patterned resist layers 210.

Following the patterning of the resist layers 210, a conductive metal 212 is formed by electrolytic plating as shown in FIG. 9E on part of the conductive metallic layer 208 which is not covered with the resist layers 210 and serves as a seed layer. Then, the resist layers 210 are removed as shown in FIG. 9F, and parts of the conductive metallic layer 208 which are not covered with the conductive metal 212 are removed as shown in FIG. 9G to form a printed wiring board.

Next, a method of forming a wiring pattern using the additive process is shown in FIGS. 10A to 10E.

According to the additive process, an insulating substrate (insulating layer) 200 as shown in FIG. 10A is perforated to form a through-hole 206 as shown in FIG. 10B. Then, as shown in FIG. 10C, resist layers 210 are formed on the surfaces of the insulating substrate 200, and the resist layers 210 are selectively exposed using a photomask and developed to form the patterned resist layers 210.

Following the formation of the resist layers 210, as shown in FIG. 10D, a conductive metallic layer 208 is formed by electroless plating on parts of the insulating substrate 200 which are not covered with the resist layers 210 and on the inner wall of the through-hole 206. Finally, as shown in FIG. 10E, the resist layers 210 are removed to form a printed wiring board.

The above-described method of forming the desired wiring pattern using the resist pattern formed by the photolithographic technology requires preparation of the photomask and in addition to the etching step for removing the unwanted part of the wiring metal, the step of exposing and developing the resist is also required to form the resist pattern. Hence, it takes time and cost to form the wiring pattern.

A method has recently been proposed in which the pattern of the wiring part of a printed wiring board (electronic circuit board) is formed by using a conductive fine particle dispersed ink system.

In the drawing system using conductive fine particle dispersed ink, a desired wiring pattern is formed by directly patterning a conductive, fine particulate material on the substrate in accordance with the wiring pattern using the ink-jet printing system.

Since this drawing system using conductive fine particle dispersed ink has no need to prepare a mask, it involves fewer steps than the method in which the photolithographic technology is applied to form a resist pattern to thereby form a desired wiring pattern.

However, to ensure that the fine particulate material exhibits its conductivity, baking must be performed under elevated temperatures for a prolonged period of time; this not only limits the type of substrate material on which a wiring pattern can be formed but it also increases the running cost and the size of the apparatus for performing treatment at high temperatures.

In order to solve these problems, for example, JP 2004-207558 A discloses a technique capable of forming wiring by applying for wiring drawing a colloidal metal solution to a substrate having a receptive layer formed thereon and sintering the substrate at a low temperature.

However, the inventor of the invention has made an attempt to form wiring by the method disclosed in JP 2004-207558 A and found that, although this method is an excellent technique in that it is capable of sintering at a low temperature and is also applicable to substrates including general-purpose resin films having low heat resistance, dendrite migration may occur on the periphery of the conductor part during use of the wiring board under high-temperature and high-humidity conditions to cause short circuit between mutually adjacent conductors (electrodes) just after application of current.

Migration as used herein refers to a phenomenon in which when a voltage is applied between conductors (electrodes) of a printed wiring board whose insulating properties are essentially kept at a good level and the printed wiring board is allowed to stand under high-temperature and high-humidity conditions, ions may leach out electrochemically from the conductors on or inside the insulator to lower the insulating properties between the conductors, thus causing an insulation failure or other defects of the printed wiring board.

In other words, an electrochemical reaction causes a metal on the anode of a printed wiring board to dissolve to have an ionic form and leach out to the cathode side, where the metallic ion receives an electron to be reduced and precipitated in a dendrite form from the cathode side on the electrode, thus causing migration.

Exemplary metals that may be used for the conductor include silver, lead, copper, tin, and gold, and migration easily occurs in the order of silver, lead, copper, tin, and gold. During use of silver for the conductor, migration easily occurs especially in cases where a nonconductor is not formed over the silver surface or silver is readily dissolved by the formation of a silver halide.

SUMMARY OF THE INVENTION

The present invention has been made to solve the above-described prior art problems and an object of the invention is to provide a wiring board forming method capable of achieving high reliability without sintering at high temperatures, that is, preventing migration from occurring. Another object of the invention is to provide a wiring board obtained by the above-described method.

A method of forming a wiring board according to a first aspect to the invention comprises: a step of forming a receptive layer having a porous structure on a substrate; a step of forming wiring portions in a desired conductive pattern on a surface of the receptive layer by ejecting a colloidal metal solution for drawing by an ink-jet system based on image date of the conductive pattern; and a step of performing a migration-proof treatment on at least part of the receptive layer exposed between mutually adjacent wiring portions.

A method of forming a wiring board according to a second aspect to the invention comprises: a step of forming a receptive layer having a porous structure on a substrate; a step of forming wiring portions in a desired conductive pattern on a surface of the receptive layer by ejecting a colloidal silver solution for drawing by an ink-jet system based on image date of the conductive pattern; and a step of forming a layer for preventing migration so as to cover the wiring portions.

A method of forming a wiring board according to a third aspect to the invention comprises: a step of forming a receptive layer having a porous structure on a substrate; and a step of forming wiring portions in a desired conductive pattern on a surface of the receptive layer by ejecting for drawing a colloidal metal solution obtained by alloying silver and a metallic material having a migration-preventing property by an ink-jet system based on image date of the conductive pattern.

A wiring board according to a third aspect to the invention formed by the method.

DETAILED DESCRIPTION OF THE INVENTION

On the following pages, the wiring board forming method of the invention is described in detail with reference to the preferred embodiments shown in the accompanying drawings.

First Embodiment

The wiring board forming method according to the first embodiment is described below with reference to FIGS. 1A to 1D.

Figure 1A:
FIGS. 1A to 1D are cross-sectional views showing in steps a wiring board forming method according to a first embodiment.
Figure 1B:
Figure 11:
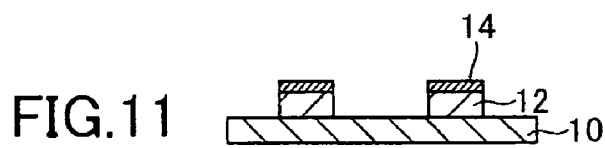
FIG. 11 is a cross-sectional view showing a receptive layer formed only a portions where a conductive pattern is to be formed.

A receptive layer 12 of a porous structure is formed on a surface of a substrate 10 as shown in FIG. 1A to prepare a receptive layer-bearing substrate as shown in FIG. 1B. The receptive layer 12 may be formed on the whole surface of the substrate 10 but is preferably formed only at portions where a conductive pattern (wiring) 14 is to be formed as shown in FIG. 11, by ejecting and applying a functional liquid containing a receptive layer material by an ink-jet system in order to prevent migration from occurring.

Figure 1C:

Then, as shown in FIG. 1C, patterned conductive metallic portions (conductive pattern) 14 are formed on the receptive layer 12. The conductive metallic portions 14 are formed by ejecting a colloidal metal solution for drawing by the ink-jet system based on image data of a conductive pattern.

A thermal ink-jet system or a piezoelectric ink-jet system may be used. However, in the thermal ink-jet system, it is preferred to use a colloidal metal solution containing an aqueous medium.

There is no particular limitation on the method of drying the colloidal metal solution and a suitable method may be selected depending on the composition of the colloidal metal solution from among drying by allowing it to stand at room temperature, drying by heating and drying by sintering. However, in this embodiment, the colloidal metal solution can be thoroughly dried by allowing it to stand at room temperature or sintering at a low temperature of 100° C. or less.

In cases where the colloidal metal solution used has a solvent with a high boiling point, it takes several hours to dry the solvent. Therefore, the colloidal metal solution is forcibly dried by a method such as hot air drying or drying by heat transfer. In terms of heat efficiency, drying by heat transfer using a hot plate or drying in a temperature-controlled bath is more preferably used for forced drying than hot air drying. In terms of resistance reduction, forced drying is preferably performed at the highest possible temperature but at the temperature which is equal to or lower than the heatproof temperature of the receptive layer-bearing substrate.

Figure 1D:
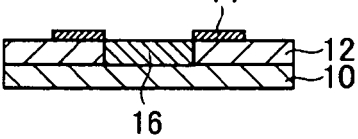

An insulating resin in the form of a migration-proof solution is applied onto the receptive layer 12 exposed between mutually adjacent conductive metallic portions 14 to obtain the receptive layer 12 of a porous structure impregnated with the insulating resin, which is then cured to form an insulating resin portion 16 in the receptive layer 12 situated between the mutually adjacent conductive metallic portions 14 as shown in FIG. 1D. In this way, a wiring board having undergone the migration-proof treatment is formed.

The insulating resin portion 16 formed by such treatment can prevent entering of moisture into the receptive layer 12 and hence occurrence of migration. The migration-proof treatment may be performed before or after drying of the colloidal metal solution for forming the conductive metallic portions 14. However, the migration-proof treatment is preferably performed after the colloidal metal solution has been dried, because if this treatment is performed before drying of the colloidal metal solution, the solvent of the colloidal metal solution may remain in the receptive layer 12. The migration-proof treatment is preferably performed in a low-humidity atmosphere in order to reduce moisture in the receptive layer which may cause migration.

The migration-proof solution in this embodiment is not particularly limited as long as it can be applied without corroding the conductive metallic portions 14, be solidified after application and exhibits insulating properties. Therefore, the migration-proof solution used may be a solution obtained by dissolving an insulating resin in a solvent, a liquid containing a thermosetting resin or a photo-curing resin, or a dispersion containing dispersed fine resin particles.

In terms of simple curing, it is preferred to use a migration-proof solution containing a thermosetting resin made of a monomer or oligomer which has at least one functional group and is capable of forming a crosslinking structure by ionic polymerization or radical polymerization using ions or radicals generated by application of heat to a thermal polymerization initiator, or a photo-curing resin made of a monomer or oligomer which is capable of forming a crosslinking structure by ionic polymerization or radical polymerization using ions or radicals generated by irradiation of a photopolymerization initiator with light.

Examples of the insulating resin include polymer materials such as novolac resins, acrylic resins, polyimide resins, olefin resins, phenolic resins, melamine resins and epoxy resins.

The migration-proof solution may be applied by any of spin coating, spray coating and ink-jet coating.

In order to prevent migration, the migration-proof solution is preferably applied not only to the surface of the receptive layer 12 between the mutually adjacent conductive metallic portions 14 but all the surfaces of the receptive layer 12 and the conductive metallic portions 14.

On the other hand, in order to reduce the amount of migration-proof solution used, the migration-proof solution is preferably applied only onto the receptive layer 12 between the mutually adjacent conductive metallic portions 14 by the ink-jet system.

The migration-proof solution is cured by a process which can be appropriately selected from thermosetting, photo-curing and drying according to the properties of the resin liquid used.

The insulating resin is used for the migration-proof solution in this embodiment, but the same effect can also be achieved by coating the migration-proof solution containing a polysilane compound. More specifically, polymethylphenylsilane is dissolved in an organic solvent; the receptive layer is impregnated with the resulting solution by application using the ink-jet system; the receptive layer is then irradiated with energy rays such as ultraviolet light for silanolization to form siloxane bonds, which cause gelation/curing to fill many pores of the receptive layer 12.

Second Embodiment

The wiring board forming method according to the second embodiment is described below with reference to FIGS. 2A to 2D.

In order to simplify the description, different portions from those of the first embodiment are only described in detail. Like elements are denoted by the same reference symbols and formed by the same method. The same treatments are also not described in detail.

Figure 2A:
FIGS. 2A to 2D are cross-sectional views showing in steps a wiring board forming method according to a second embodiment.
Figure 2B:
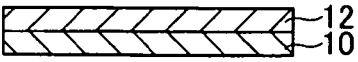

A receptive layer 12 of a porous structure is formed on a surface of a substrate 10 as shown in FIG. 2A to prepare a receptive layer-bearing substrate as shown in FIG. 2B.

Figure 2C:

Then, as shown in FIG. 2C, a colloidal metal solution is applied to the receptive layer 12 by the ink-jet system to form patterned conductive metallic portions 14.

Figure 2D:
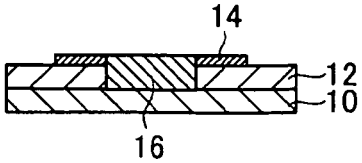

Then, an insulating resin in the form of a migration-proof solution is applied onto the receptive layer 12 exposed between mutually adjacent conductive metallic portions 14 and cured to form an insulating resin portion 16 in the space between the mutually adjacent conductive metallic portions 14 as shown in FIG. 2D. The insulating resin portion 16 has a height corresponding to the thicknesses of the receptive layer 12 and the conductive metallic portion 14. In this way, a wiring board having undergone the migration-proof treatment is formed.

Entering of moisture into the receptive layer 12 and ionization of the metal in the conductive metallic portions 14 and its leaching out can be prevented by performing such a treatment for preventing migration.

Third Embodiment

The wiring board forming method according to the third embodiment is described below with reference to FIGS. 3A to 3D.

In order to simplify the description, different portions from those of the first and second embodiments are only described in detail. Like elements are denoted by the same reference symbols and formed by the same method. The same treatments are also not described in detail.

Figure 3A:
FIGS. 3A to 3D are cross-sectional views showing in steps a wiring board forming method according to a third embodiment.
Figure 3B:
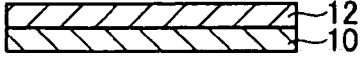

A receptive layer 12 of a porous structure is formed on a surface of a substrate 10 as shown in FIG. 3A to prepare a receptive layer-bearing substrate as shown in FIG. 3B.

Figure 3C:
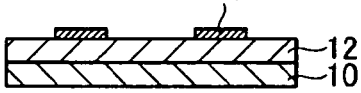

Then, as shown in FIG. 3C, a colloidal metal solution is applied to the receptive layer 12 by the ink-jet system to form patterned conductive metallic portions 14.

Figure 3D:
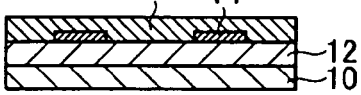

Then, a water repellent serving as the migration-proof solution is applied onto all the surfaces of the conductive metallic portions 14 and the receptive layer 12 to form a water-repellent treatment portion 18 as shown in FIG. 3D. In other words, a wiring board having undergone the migration-proof treatment using the water repellent is formed.

The water repellent should be applied at least to the surface of the receptive layer 12 exposed between mutually adjacent conductive metallic portions 14 in order to prevent moisture from adhering to and entering the receptive layer 12. The ink-jet system may be used for the method of applying the water repellent.

Monomers, oligomers, polymers and other water-repellent polymer compounds containing fluorine atom in the molecule may be used for the water repellent. Examples thereof include polytetrafluoroethylene (PTFE), ethylene-tetrafluoroethylene copolymer, hexafluoropropylene-tetrafluoroethylene copolymer, polyvinylidene fluoride, ethylene having a long-chain perfluoroalkyl structure, acrylate, methacrylate, vinyl, urethane, and silicone polymer.

Of the water-repellent polymer compounds, solvent-soluble fluororesins are particularly preferred. Exemplary commercial products include CYTOP available from Asahi Glass Co., Ltd. and INT-340VC available from NI Material Co., Ltd. It is desirable to use these products after having been diluted according to the ejectability in the ink-jet system.

Fourth Embodiment

The wiring board forming method according to the fourth embodiment is described below with reference to FIGS. 4A to 4D.

In order to simplify the description, different portions from those of the first to third embodiments are only described in detail. Like elements are denoted by the same reference symbols and formed by the same method. The same treatments are also not described in detail.

Figure 4A:
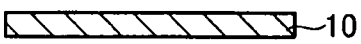
FIGS. 4A to 4D are cross-sectional views showing in steps a wiring board forming method according to a fourth embodiment.
Figure 4B:

A receptive layer 12 of a porous structure is formed on a surface of a substrate 10 as shown in FIG. 4A to prepare a receptive layer-bearing substrate as shown in FIG. 4B.

Figure 4C:

Then, as shown in FIG. 4C, a dispersion of silver particles serving as a colloidal metal solution is applied to the receptive layer 12 by the ink-jet system to form patterned conductive metallic portions 14. In cases where the conductive metallic portions 14 made of silver are formed on the receptive layer 12, adhesion between the receptive layer 12 and the conductive metallic portions 14 can be improved while keeping the colloidal metal solution from spreading out in a wet state over the receptive layer 12, thus enabling the drawing pattern to be made thinner.

In addition, the solvent of the colloidal metal solution is absorbed into the receptive layer 12 of the porous structure, whereas the colloidal metal (silver) remains on the surface of the receptive layer 12. Therefore, the conductive metallic portions 14 can have a large thickness by multi-layer drawing of the colloidal metal solution.

Figure 4D:

Then, as shown in FIG. 4D, a water repellent serving as the migration-proof solution is applied so as to cover the conductive metallic portions 14 to form water-repellent treatment portions 18. In other words, a wiring board having undergone the migration-proof treatment is formed.

Examples of the water repellent that may be used in this embodiment include fluoroalkylamines which have a high ability to adsorb onto the surfaces of silver particles. The ink-jet system may be used for the method of applying the water repellent.

A fluoroalkylamine is applied at least onto silver wiring and subjected to heat treatment to cause the amino group in the fluoroalkylamine to form a complex on the silver particles, thus effectively preventing the silver atom from leaching into water.

Fifth Embodiment

The wiring board forming method according to the fifth embodiment is described below with reference to FIGS. 5A to 5D.

In order to simplify the description, different portions from those of the first to fourth embodiments are only described in detail. Like elements are denoted by the same reference symbols and formed by the same method. The same treatments are also not described in detail.

Figure 5A:
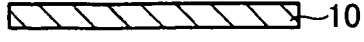
FIGS. 5A to 5D are cross-sectional views showing in steps a wiring board forming method according to a fifth embodiment.
Figure 5B:

A receptive layer 12 of a porous structure is formed on a surface of a substrate 10 as shown in FIG. 5A to prepare a receptive layer-bearing substrate as shown in FIG. 5B.

Figure 5C:

Then, as shown in FIG. 5C, a colloidal metal solution is applied to the receptive layer 12 by the ink-jet system to form patterned conductive metallic portions 14.

Figure 5D:

Then, as shown in FIG. 5D, the receptive layer 12 exposed between mutually adjacent conductive metallic portions 14 is removed to perform the migration-proof treatment thereby forming a wiring board. The receptive layer 12 holds moisture of an aqueous ink (colloidal metal solution) in many pores and hence easily absorbs moisture that may cause migration. Therefore, migration can be effectively prevented from occurring by removing unnecessary portions of the receptive layer 12 situated between the conductive metallic portions 14.

The receptive layer 12 may be removed by a process such as laser ablation.

Sixth Embodiment

The wiring board forming method according to the sixth embodiment is described below with reference to FIGS. 6A to 6D. In order to simplify the description, different portions from those of the first to fifth embodiments are only described in detail. Like elements are denoted by the same reference symbols and formed by the same method. The same treatments are also not described in detail.

Figure 6A:
FIGS. 6A to 6D are cross-sectional views showing in steps a wiring board forming method according to a sixth embodiment.
Figure 6B:

A receptive layer 12 of a porous structure is formed on a surface of a substrate 10 as shown in FIG. 6A to prepare a receptive layer-bearing substrate as shown in FIG. 6B.

Figure 6C:

Then, as shown in FIG. 6C, an alloying material composed of a colloidal metal solution containing an alloy of silver that may easily cause migration and a metal having resistance to migration is applied to the receptive layer 12 by the ink-jet system to form patterned conductive metallic portions (alloying treatment portions) 20. In this way, a wiring board having undergone the migration-proof treatment is formed.

Illustrative examples of the alloying material include colloidal solutions of silver-palladium alloys and those of silver-copper alloys. Such alloying materials enable migration to be suppressed.

Figure 6D:
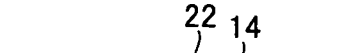

Alternatively, following the formation of the conductive metallic portions 14 made of silver on the receptive layer 12 by the ink-jet system, plated portions 22 made of a metal having high resistance to migration are formed so as to cover the individual conductive metallic portions 14 as shown in FIG. 6D. A wiring board capable of suppressing migration is also formed by this process.

Illustrative examples of the material that may be preferably used to form the plated portions 22 include gold and copper.

The wiring boards formed in the first to sixth embodiments may be used as printed boards for electronic circuits. In addition, these wiring boards may also be used for electromagnetic interference shielding materials which require electromagnetic interference shielding properties (effect of conductivity).

The conductive metallic portions 14 preferably have a surface resistance of not more than 10 Ω/sq in cases where the wiring boards are used for electromagnetic interference shielding materials, not more than 2.5 Ω/sq in cases where they are used for translucent electromagnetic interference shielding films of plasma display panels (PDPs), and not more than 1.5 Ω/sq and more preferably not more than 0.5 Ω/sq in cases where they are used in plasma display panel TV for customer use.

In cases where the wiring board of the invention is used for electromagnetic interference shielding films of PDPs, the conductive metallic portions 14 preferably have a line width of not more than 20 μm and a line-to-line spacing of at least 50 μm. For such a purpose as ground connection, the conductive metallic portions 14 may have a portion which has a larger line width than 20 μm. In order to prevent the image from being more conspicuous, the conductive metallic portions 14 preferably have a line width of less than 15 μm, more preferably less than 10 μm and most preferably less than 7 μm.

In cases where the wiring board of the invention is used for electromagnetic interference shielding films of PDPs, the conductive metallic portions 14 preferably have an aperture ratio of at least 85%, more preferably at least 90% and most preferably at least 95% in terms of visible light transmittance. The "aperture ratio" refers to a ratio of portions where the conductive metallic portions 14 do not exist to the whole. For example, the mesh in a square lattice form with a line width of 10 μm and a pitch of 200 μm has an aperture ratio of 90%. The conductive metallic portions of the invention are not particularly limited for the upper limit of the aperture ratio but preferably have an aperture ratio of not more than 98% in consideration of the relation with the surface resistance value and the line width value.

In cases where the wiring board of the invention is used for electromagnetic interference shielding films of PDPs, the thickness of the conductive metallic portions 14 is preferably as small as possible for use in electromagnetic interference shielding materials of displays, because the displays can have a wider viewing angle with a smaller thickness of the conductive metallic portions 14. From such a viewpoint, the layer of the conductive metal carried in the conductive metallic portions 14 preferably has a thickness of less than 9 μm, more preferably at least 0.1 μm but less than 5 μm, and even more preferably at least 0.1 μm but less than 3 μm.

The materials of the substrate 10 and the receptive layer 12 as well as the colloidal metal solution making up the conductive metallic portions 14 that may be used in the invention are described below in detail.

The substrate 10 to be used in the invention is not limited in any particular way and plastic films, plastic plates, glass plates and the like can be used; starting materials that can be used to make plastic films and plastic plates include: polyesters such as polyethylene terephthalate (PET) and polyethylene naphthalate (PEN); polyolefins such as polyethylene (PE), polypropylene (PP), polystyrene, and EVA; vinyl resins such as polyvinyl chloride and polyvinylidene chloride; as well as polyetheretherketone (PEEK), polysulfone (PSF), polyethersulfone (PES), polycarbonate (PC), polyamide, polyimide (PI), acrylic resins, and triacetyl cellulose (TAC).

In the invention, plastic films and plastic plates can be used in single layers or as multi-layered films comprising two or more layers.

Use may also be made of aluminum or other metallic substrates whose surfaces are insulated.

In cases where the wiring board is used for electromagnetic interference shielding films of displays such as PDPs, transparency is required. Therefore, the substrate desirably has high transparency. In this case, plastic films or plastic plates preferably have a total visible light transmittance of 70 to 100%, more preferably 85 to 100% and even more preferably 90 to 100%. Substrates having been colored to such an extent that the required transparency is not prevented may be used for the plastic films and plastic plates.

The receptive layer 12 used in the invention is a porous receptive layer containing a cationic modified self-emulsifying polymer, inorganic fine particles, a polyvinyl alcohol having a saponification value of 92 to 98 mol %, a water-soluble aluminum compound, a zirconium compound, and a crosslinking agent.

<Cationic Modified Self-Emulsifying Polymer>

The receptive layer 12 of the invention includes a "cationic modified self-emulsifying polymer". This "cationic modified self-emulsifying polymer" means a polymer compound from which can be obtained an emulsified dispersion spontaneously stabilized in an aqueous dispersion medium without the addition of emulsifier or surfactant, or if they are used by adding one of them in a trace amount. Quantitatively, the "cationic modified self-emulsifying polymer" represents a polymer substance which stably has emulsion dispersibility at a concentration of at least 0.5 wt % in an aqueous dispersion medium at room temperature of 25° C. This concentration is preferably at least 1 wt %, and more preferably at least 3 wt %.

More specific examples of the "cationic modified self-emulsifying polymer" of the invention include polyaddition or polycondensation based polymer compounds having cationic groups such as primary, secondary and tertiary amino groups, and quaternary ammonium groups.

For the above polymers, vinyl polymers obtained by polymerizing the following vinyl monomers can be used. Examples of the vinyl monomers include: acrylic acid esters and methacrylic acid esters (examples of the ester group include alkyl and aryl groups which may have substituents, such as methyl, ethyl, n-propyl, isopropyl, n-butyl, sec-butyl, tert-butyl, hexyl, 2-ethylhexyl, tert-octyl, 2-chloroethyl, cyanoethyl, 2-acetoxyethyl, tetrahydrofurfuryl, 5-hydroxypentyl, cyclohexyl, benzyl, hydroxyethyl, 3-methoxybutyl, 2-(2-methoxyethoxy)ethyl, 2,2,2-tetrafluoroethyl, 1H,1H,2H,2H-perfluorodecyl, phenyl, 2,4,5-tetramethylphenyl, and 4-chlorophenyl); vinyl esters, specifically aliphatic carboxylic acid vinyl esters which may have substituents (for example, vinyl acetate, vinyl propionate, vinyl butyrate, vinyl isobutyrate, vinyl caproate, and vinyl chloroacetate), and aromatic carboxylic acid vinyl esters which may have substituents (for example vinyl benzoate, vinyl 4-methyl benzoate, and vinyl salicylate); acrylamides, specifically acrylamide, N-monosubstituted acrylamides, and N-disubstituted acrylamides (substituents are alkyl, aryl, and silyl groups which may have substituents, for example methyl, n-propyl, isopropyl, n-butyl, tert-butyl, tert-octyl, cyclohexyl, benzyl, hydroxymethyl, alkoxymethyl, phenyl, 2,4,5-tetramethylphenyl, 4-chlorophenyl, and trimethylsilyl groups); methacrylamides, specifically methacrylamide, N-monosubstituted methacrylamides, and N-disubstituted methacrylamides (substituents are alkyl, aryl, and silyl groups which may have substituents, for example methyl, n-propyl, isopropyl, n-butyl, tert-butyl, tert-octyl, cyclohexyl, benzyl, hydroxymethyl, alkoxymethyl, phenyl, 2,4,5-tetramethylphenyl, 4-chlorophenyl, and trimethylsilyl groups); olefins (for example ethylene, propylene, 1-pentene, vinyl chloride, vinylidene chloride, isoprene, chloroprene, and butadiene), styrenes (for example styrene, methylstyrene, isopropylstyrene, methoxystyrene, acetoxystyrene, and chlorostyrene), and vinyl ethers (for example methyl vinyl ether, butyl vinyl ether, hexyl vinyl ether, and methoxyethyl vinyl ether).

Other exemplary vinyl monomers include crotonate esters, itaconate esters, maleate diesters, fumarate diesters, methyl vinyl ketone, phenyl vinyl ketone, methoxyethyl vinyl ketone, N-vinyloxazolidone, N-vinylpyrrolidone, methylene malonitrile, diphenyl-2-acryloyloxyethyl phosphate, diphenyl-2-methacryloyloxyethyl phosphate, dibutyl-2-acryloyloxyethyl phosphate, and dioctyl-2-methacryloyloxyethyl phosphate.

Exemplary monomers having the cationic group include those having a tertiary amino group, such as dialkylaminoethyl methacrylates, and dialkylaminoethyl acrylates.

Exemplary polyurethanes applicable to the cationic modified self-emulsifying polymer include those synthesized by the polyaddition reactions of various combinations of the diol compounds with the diisocyanate compounds illustrated below.

Specific examples of the diol compounds include ethylene glycol, 1,2-propanediol, 1,3-propanediol, 1,2-butanediol, 1,3-butanediol, 2,3-butanediol, 2,2-dimethyl-1,3-propanediol, 1,2-pentanediol, 1,4-pentanediol, 1,5-pentanediol, 2,4-pentanediol, 3,3-dimethyl-1,2-butanediol, 2-ethyl-2-methyl-1,3-propanediol, 1,2-hexanediol, 1,5-hexanediol, 1,6-hexanediol, 2,5-hexanediol, 2-methyl-2,4-pentanediol, 2,2-diethyl-1,3-propanediol, 2,4-dimethyl-2,4-pentanediol, 1,7-heptanediol, 2-methyl-2-propyl-1,3-propanediol, 2,5-dimethyl-2,5-hexanediol, 2-ethyl-1,3-hexanediol, 1,2-octanediol, 1,8-octanediol, 2,2,4-trimethyl-1,3-pentanediol, 1,4-cyclohexanedimethanol, hydroquinone, diethylene glycol, triethylene glycol, dipropylene glycol, tripropylene glycol, polyethylene glycols (with average molecular weights of 200, 300, 400, 600, 1000, 1500, 4000), polypropylene glycols (with average molecular weights of 200, 400, 1000), polyester polyols, 4,4'-dihydroxy-diphenyl-2,2-propane, and 4,4'-dihydroxyphenylsulfone.

Exemplary diisocyanate compounds include methylene diisocyanate, ethylene diisocyanate, isophorone diisocyanate, hexamethylene diisocyanate, 1,4-cyclohexane diisocyanate, 2,4-toluene diisocyanate, 2,6-toluene diisocyanate, 1,3-xylylene diisocyanate, 1,5-naphthalene diisocyanate, m-phenylene diisocyanate, p-phenylene diisocyanate, 3,3'-dimethyl-4,4'-diphenylmethane diisocyanate, 3,3'-dimethyl-biphenylene diisocyanate, 4,4'-biphenylene diisocyanate, dicyclohexylmethane diisocyanate, and methylene bis(4-cyclohexyl isocyanate).

Examples of the cationic group contained in the cationic group-containing polyurethane include cationic groups such as primary, secondary and tertiary amines and quaternary ammonium salts. In the cationic modified self-emulsifying polymer that may be used in the invention, it is preferable to use a urethane resin having a cationic group such as a tertiary amine or a quaternary ammonium salt.

The cationic group-containing polyurethane can be obtained, for example, by using a material which is obtained by introducing a cationic group into the diol mentioned above at the time of synthesizing the polyurethane. In the case of the quaternary ammonium salt, polyurethane containing a tertiary amino group may be quaternized with a quaternizing agent.

The diol compounds and diisocyanate compounds that may be employed for synthesizing the polyurethane may be used alone or be used in combination of two or more in various proportions depending on various purposes (for example, controlling the polymer glass transition temperature (Tg), improving solubility, providing compatibility with a colloidal metal solution, and improving stability of a dispersion).

Exemplary polyesters applicable to the cationic modified self-emulsifying polymer include those synthesized by polycondensation reactions of various combinations of the diol compounds with the dicarboxylic acid compounds illustrated below.

Examples of the dicarboxylic acid compounds include oxalic acid, malonic acid, succinic acid, glutaric acid, dimethylmalonic acid, adipic acid, pimelic acid, α,α-dimethylsuccinic acid, acetonedicarboxylic acid, sebacic acid, 1,9-nonanedicarboxylic acid, fumaric acid, maleic acid, itaconic acid, citraconic acid, phthalic acid, isophthalic acid, terephthalic acid, 2-butylterephthalic acid, tetrachloroterephthalic acid, acetylenedicarboxylic acid, poly(ethyleneterephthalate)dicarboxylic acid, 1,2-cyclohexanedicarboxylic acid, 1,4-cyclohexanedicarboxylic acid, ω-poly(ethylene oxide) dicarboxylic acid, and p-xylylenedicarboxylic acid.

When polycondensed with a diol compound, the dicarboxylic acid compound may be used in the form of an alkyl ester (for example, dimethyl ester) of a dicarboxylic acid or an acid chloride of a dicarboxylic acid, or be used in the form of an acid anhydride such as maleic anhydride, succinic anhydride or phthalic anhydride.

The same compounds as the diols illustrated for the polyurethane may be used for the diol compound.

The cationic group-containing polyester can be obtained by synthesis using a dicarboxylic acid compound having a cationic group such as a primary, secondary or tertiary amine or a quaternary ammonium salt.

The diol compounds, dicarboxylic acids and hydroxycarboxylate ester compounds used in the synthesis of the polyester may be used alone or be used in combination of two or more in arbitrary proportions depending on various purposes (for example, controlling the polymer glass transition temperature (Tg), improving solubility, compatibility with a colloidal metal solution, and stability of a dispersion).

The content of the cationic group in the cationic modified self-emulsifying polymer is preferably from 0.1 to 5 mmol/g, and more preferably from 0.2 to 3 mmol/g. The polymer dispersion stability decreases when the content of the cationic group is too low, whereas the compatibility with the binder decreases at a too high content.

The cationic modified self-emulsifying polymer is preferably one having a cationic group such as a tertiary amino group or a quaternary ammonium base, and most preferably a urethane resin (polyurethane) having the cationic group as described above.

When the self-emulsifying polymers are used in the receptive layer 12, particularly important is the glass transition temperature thereof. In order to suppress bleeding over time of the conductive pattern having been formed by the ink-jet system over an extended period of time, the glass transition temperature of the self-emulsifying polymer is preferably below 50° C. Further, the glass transition temperature of the self-emulsifying polymer is more preferably 30° C. or below, and most preferably 15° C. or below. At a glass transition temperature of 50° C. or above, the dimensional stability (curling) may worsen. There is no particular restriction on the lower limit of the glass transition temperature but, for general applications it is of the order of about −30° C., and at a lower temperature than this value, manufacturability may be reduced during preparation of an aqueous dispersion.

In general, the self-emulsifying polymer preferably has a weight-average molecular weight (Mw) of 1,000 to 200,000, and more preferably 2,000 to 50,000. If the molecular weight is less than 1,000, there is a tendency for a stable aqueous dispersion not to be readily obtained. If the molecular weight exceeds 200,000, there is a tendency for the solubility to be reduced while increasing the liquid viscosity, whereby it may be difficult to reduce the average particle size of the aqueous dispersion and particularly to control it to 0.05 μm or less.

The content of the self-emulsifying polymer in the receptive layer 12 of the invention is preferably in the range of 0.1 to 30 wt %, more preferably 0.3 to 20 wt %, and most preferably 0.5 to 15 wt % with respect to the total solids making up the receptive layer 12. At a content of less than 0.1 wt %, there is a tendency for the effect of improving bleeding over time not to be achieved satisfactorily, whereas at a content exceeding 30 wt %, there is a tendency for the ratio of the binder components such as inorganic fine particles and polyvinyl alcohol to be reduced, leading to a decrease in the ink (colloidal metal solution) solvent absorbability of the receptive layer.

Next, the method of preparing the aqueous dispersion of the self-emulsifying polymer is described.

The aqueous dispersion having an average particle size of 0.05 μm or less can be obtained by mixing the self-emulsifying polymer and optionally additives with an aqueous solvent, and by granulating the mixture liquid using a disperser. In order to obtain the aqueous dispersion, various known dispersers may be used as exemplified by high speed rotary dispersers, medium agitation type dispersers (such as ball mills, sand mills, and bead mills), ultrasonic dispersers, colloid mill dispersers, and high pressure dispersers. However, from the viewpoint of efficient dispersion of the aggregated fine particles formed, it is preferred to use a medium agitation type disperser, a colloid mill disperser or a high pressure disperser.

The high pressure disperser (homogenizer) is described for its detailed mechanism in U.S. Pat. No. 4,533,254, and JP 6-47264 A, and commercially available apparatuses such as GAULIN HOMOGENIZER (APV Gaulin Inc.), MICROFLUIDIZER (Microfluidics Inc.), and ALTIMIZER (Sugino Machine Limited) may be used. Recently, a high pressure homogenizer equipped with a mechanism to form fine particles in an ultrahigh pressure jet flow as described in U.S. Pat. No. 5,720,551 is particularly effective for emulsifying dispersion of the invention. DeBEE2000 (Bee International Ltd.) is an example of an emulsifying apparatus using the ultrahigh pressure jet flow.

Examples of the aqueous solvent that may be used in the dispersing process include water, an organic solvent, and a mixed solvent thereof. Examples of the organic solvent that may be used for the dispersion include alcohols such as methanol, ethanol, n-propanol, i-propanol, and methoxy propanol; ketones such as acetone, and methyl ethyl ketone; tetrahydrofuran, acetonitrile, ethyl acetate, and toluene.

The self-emulsifying polymer of the invention may be spontaneously rendered into a stable emulsified dispersion, but a small amount of dispersant (surfactant) may be used to speed up the emulsifying dispersion or to make it more stable. Examples of the surfactant that may be used for such purposes include anionic surfactants such as fatty acid salts, alkylsulfate ester salts, alkylbenzenesulfonate salts, alkylnaphthalenesulfonate salts, dialkylsulfosuccinate salts, alkylphosphate ester salts, naphthalenesulfonic acid formalin condensates, and polyoxyethylene alkylsulfate ester salts; and nonionic surfactants such as polyoxyethylene alkyl ethers, polyoxyethylene alkylallyl ethers, polyoxyethylene fatty acid esters, sorbitan fatty acid esters, polyoxyethylene sorbitan fatty acid esters, polyoxyethylene alkylamines, glycerine fatty acid esters, and oxyethylene oxypropylene block copolymers.

Further, SURFYNOLS (Air Products & Chemicals) which is an acetylene-based polyoxyethylene oxide surfactant is also preferably used. Furthermore, amine oxide ampholytic surfactants such as N,N-dimethyl-N-alkylamine oxide are also preferable. Surfactants illustrated in JP 59-157, 636, pp. (37) to (38) and Research Disclosure No. 308119 (1989) may also be used.

A water-soluble polymer may also be added together with the surfactant in order to achieve stabilization just after emulsification. Examples of the water-soluble polymer that may be preferably used include polyvinyl alcohol, polyvinyl pyrrolidone, polyethylene oxide, polyacrylic acid, polyacrylamide, and copolymers thereof. It is also preferable to use naturally occurring water-soluble polymers such as polysaccharides, casein, and gelatin.

In cases where the self-emulsifying polymer is dispersed in an aqueous medium by the emulsifying dispersion method, it is particularly important to control the particle size thereof. It is necessary to reduce the average particle size of the self-emulsifying polymer in the aqueous dispersion in order to increase the colloidal metal purity and the colloidal metal concentration during formation of a conductive pattern by the ink-jet system. Specifically, the receptive layer 12 of the invention contains the self-emulsifying polymer having a volume-average particle size of preferably 0.05 μm or less, more preferably 0.04 μm or less, and even more preferably 0.03 μm or less.

<Inorganic Fine Particles>

The receptive layer 12 according to the invention contains inorganic fine particles.

Examples of the inorganic fine particles include silica fine particles, colloidal silica, titanium dioxide, barium sulfate, calcium silicate, zeolite, kaolinite, halloysite, mica, talc, calcium carbonate, magnesium carbonate, calcium sulfate, boehmite, and pseudoboehmite. Among these, silica fine particles are preferable.

The silica fine particles absorb and hold ink (colloidal metal solution) solvent with high efficiency because of the particularly large specific surface area and can impart transparency to the receptive layer 12 because of the low refractive index through dispersion of such particles up until the fine particles have a suitable size. The transparency of the receptive layer 12 is important in electromagnetic interference shielding films of PDPs or other applications which require transparency.

The inorganic fine particles have an average primary particle size of preferably 20 nm or less, more preferably 15 nm or less, and even more preferably 10 nm or less. When the average primary particle size is 20 nm or less, the ink (colloidal metal solution) solvent-absorbing property can be effectively improved while simultaneously enhancing the smoothness of the surface of the receptive layer 12.

The inorganic fine particles have a specific surface area as measured by BET method of preferably 200 $m^2/g$ or more, more preferably 250 $m^2/g$ or more, and even more preferably 380 $m^2/g$ or more. The inorganic fine particles having a specific surface area of 200 $m^2/g$ or more enable the transparency of the receptive layer 12 to be kept at a high level.

The BET method as used in the invention is a method of determining the surface area of powder by gas-phase adsorption, more specifically a method in which the total surface area, that is, the specific surface area per g of a sample is determined from the adsorption isotherm. Nitrogen gas is commonly used as the adsorbed gas, and most widely used is a method of determining the amount of adsorption by the change in pressure or volume of the adsorbed gas. One of the most famous equations describing the isotherm of multimolecular adsorption is the equation of Brunauer, Emmett, and Teller (BET equation). The surface area is calculated by multiplying the adsorption amount determined by the BET equation by the surface area occupied by a single adsorbed molecule.

In particular, silica fine particles have silanol groups attached to the surfaces thereof and such particles readily adhere to each other through hydrogen bonding of the silanol groups, and there is an effect of particle adhesion through the silanol groups and the water soluble resin. Hence, in cases where the average primary particle size is 20 nm or less as described above, the receptive layer 12 can have a large porosity and form a highly transparent structure, thus effectively improving the ink (colloidal metal solution) solvent-absorbing property.

Silica fine particles are commonly classified roughly into wet method particles and dry method (vapor-phase process) particles according to the method of manufacture. In the wet method, silica fine particles are mainly produced by generating an activated silica by acid decomposition of a silicate, polymerizing to a proper degree the activated silica, and aggregating and precipitating the resulting polymeric silica to give a hydrous silica. On the other hand, in the vapor-phase process, anhydrous silica is mainly produced by high-temperature vapor-phase hydrolysis of a silicon halide (flame hydrolysis process), or by reductively heating and vaporizing silica sand and coke in an electric furnace by applying an arc discharge and then oxidizing the vaporized silica with air (arc method). The "vapor-phase process silica" means a finely-divided anhydrous silica produced by the vapor-phase process.

The vapor-phase process silica is different in the density of silanol groups on the surface and the presence of pores and exhibits different properties from hydrous silica, but is suitable for forming a three-dimensional structure having a higher porosity. Although the reason is not clear, in the case of hydrous silica, fine particles have a higher density of 5 to 8 silanol groups/nm$^2$ at their surfaces. Thus, the silica fine particles tend to aggregate densely. On the other hand, the vapor-phase process silica particles have a lower density of 2 to 3 silanol groups/nm$^2$ at their surfaces. Therefore, vapor-phase process silica is presumed to undergo more scarce, softer aggregation (flocculation), resulting in a structure having a higher porosity.

In the invention, the vapor-phase process silica fine particles (anhydrous silica) obtained by the dry method are preferable, with the silica fine particles having a density of 2 to 3 silanol groups/nm$^2$ at their surfaces.

The inorganic fine particles that may be most preferably used in the invention are particles of a vapor-phase process silica having a BET specific surface area of 200 m$^2$/g or more.

<Polyvinyl Alcohol>

The polyvinyl alcohol for use in the invention has a saponification value of 92 to 98 mol % (hereinafter, referred to as "polyvinyl alcohol of the invention"). At a polyvinyl alcohol saponification value of lower than 92 mol %, the viscosity of the coating liquid (functional liquid containing the receptive layer material) is increased while reducing the coating stability. On the other hand, a polyvinyl alcohol having a saponification value of more than 98 mol % is also undesirable, because the ink (colloidal metal solution) solvent-absorbing property is reduced. The saponification value is more preferably 93 to 97 mol %.

The polymerization degree of the polyvinyl alcohol according to the invention is preferably 1,500 to 3,600, and more preferably 2,000 to 3,500. At a polymerization degree of less than 1,500, cracks occur at the receptive layer 12. A polymerization degree of more than 4,000 is not preferable, because such a polyvinyl alcohol leads to an increase in the viscosity of coating liquid (functional liquid containing the receptive layer material).

In the practice of the invention, a water-soluble resin other than the polyvinyl alcohol according to the invention may be used in combination with the polyvinyl alcohol. Examples of the water-soluble resin that may be used in combination include polyvinyl alcohols (PVAs) which have a hydroxy group as a hydrophilic structural unit and whose saponification values are outside the above-defined range, cationic modified polyvinyl alcohols, anionic modified polyvinyl alcohols, silanol-modified polyvinyl alcohols, polyvinylacetal, cellulosic resins (methylcellulose (MC), ethylcellulose (EC), hydroxyethylcellulose (HEC), carboxymethylcellulose (CMC), hydroxypropylcellulose (HPC), etc.), chitins, chitosans, and starch; hydrophilic ether bond-containing resins such as polyethylene oxide (PEO), polypropylene oxide (PPO), polyethylene glycol (PEG), and polyvinylether (PVE); and hydrophilic amide group- or amide bond-containing resins such as polyacrylamide (PAAM) and polyvinyl pyrrolidone (PVP). Other examples include compounds having a carboxy group as a dissociative group such as polyacrylate salts, maleic acid resins, alginate salts, and gelatins.

When the polyvinyl alcohol of the invention and the water-soluble resin described above are used in combination, the ratio of the polyvinyl alcohol of the invention to the total amount of the polyvinyl alcohol of the invention and the water-soluble resin is preferably 1 to 30 wt %, more preferably 3 to 20 wt %, and even more preferably 6 to 12 wt %.

In order to prevent reduction of film strength and cracking during drying due to a too small content of the polyvinyl alcohol, and to prevent reduction of ink (colloidal metal solution) solvent-absorbing property that may be caused by a reduced porosity resulting from pores easily blocked by the resin due to a too large polyvinyl alcohol content, the content of the polyvinyl alcohol of the invention is preferably 9 to 40 wt %, and more preferably 12 to 33 wt % with respect to the total solids content in the receptive layer 12.

The polyvinyl alcohol contains a hydroxy group in the structural unit. Hydrogen bonding between the hydroxy groups and the silanol groups at the surfaces of silica fine particles allows the silica fine particles to form a three-dimensional network structure having secondary particles as the network chain unit. It is deemed that formation of such three-dimensional network structure enables the receptive layer 12 having a porous structure with a high porosity to be formed.

In an ink-jet recording medium (a receptive layer-bearing substrate), the porous receptive layer 12 obtained as described above can rapidly absorb the ink (colloidal metal solution) solvent by capillary action to form printed dots superior in circularity and having no bleeding of the ink (colloidal metal solution).

<Content Ratio of Inorganic Fine Particles to Inventive Polyvinyl Alcohol>

The content ratio of inorganic fine particles (preferably, silica fine particles; x) to the polyvinyl alcohol of the invention (when the polyvinyl alcohol of the invention is used in combination with the water-soluble resin, the total weight of the polyvinyl alcohol and the water-soluble resin is applied; "y") [PB ratio (x/y), weight of inorganic fine particles relative to 1 part by weight of polyvinyl alcohol of the invention] also greatly influences the film structure of the receptive layer 12. That is, the larger the PB ratio is, the more the porosity, micropore volume and specific surface area (per unit weight) increase. Specifically, the PB ratio (x/y) is preferably 1.5/1 to 10/1 in order to prevent reduction of film strength and cracking during drying due to a too large PB ratio, and to prevent reduction of ink (colloidal metal solution) solvent-absorbing property that may be caused by a reduced porosity resulting from pores easily blocked by the resin due to a too small PB ratio.

When conveyed in a conveying system of an ink-jet printer, a stress may be applied to the ink-jet recording medium (a receptive layer-bearing substrate). Accordingly, the receptive layer 12 should have sufficiently high film strength. The receptive layer 12 should also have sufficiently high film strength in order to prevent cracking and delamination of the receptive layer 12 in cases where the recording medium is cut into sheets. The PB ratio (x/y) is preferably 5/1 or less in consideration of this point but is preferably 2/1 or more in order to ensure that the solvent of the ink (colloidal metal solution) is absorbed at high speed in the ink-jet printer.

For example, in cases where a coating liquid containing anhydrous silica fine particles having an average primary particle size of 20 nm or less and the polyvinyl alcohol of the invention completely dispersed in an aqueous solution at a PB ratio (x/y) of 2/1 to 5/1 (functional liquid containing the receptive layer material), is applied to the substrate 10 and the receptive layer 12 is dried, a three-dimensional network structure having the secondary particles of silica fine particles as the network chain unit is formed. Such a coating liquid easily provides a translucent porous film having an average pore size of 30 nm or less, a porosity of 50 to 80%, a pore specific volume of 0.5 ml/g or more, and a specific surface area of 100 $m^2/g$ or more.

<Crosslinking Agent>

The receptive layer 12 according to the invention contains a crosslinking agent. The receptive layer 12 according to the invention is preferably a porous layer obtained by curing the polyvinyl alcohol according to the invention and optionally the water-soluble resin through a crosslinking reaction using the crosslinking agent.

The above crosslinking agent may be selected as appropriate in consideration of the relation with the polyvinyl alcohol of the invention and optionally the water-soluble resin contained in the receptive layer 12, but boron compounds are preferable in terms of faster crosslinking reaction rate. Examples of the boron compounds include borax, boric acid, borate salts [e.g., orthoborate salts, $InBO_3$, $ScBO_3$, $YBO_3$, $LaBO_3$, $Mg_3(BO_3)_2$, and $CO_3(BO_3)_2$], diborate salts [e.g., $Mg_2B_2O_5$, and $CO_2B_2O_5$], metaborate salts [e.g., $LiBO_2$, $Ca(BO_2)_2$, $NaBO_2$, and $KBO_2$], tetraborate salts [e.g., $Na_2B_4O_7 \cdot 10H_2O$], and pentaborate salts [e.g., $KB_5O_8 \cdot 4H_2O$, $Ca_2B_6O_{11} \cdot 7H_2O$, and $CsB_5O_5$]. Among them, borax, boric acid and borates are preferable since they are able to promptly cause a crosslinking reaction. Boric acid or a borate salt is particularly preferable, and the combination with the polyvinyl alcohol which is a water-soluble resin is most preferable.

In the invention, the crosslinking agent is preferably included in an amount of 0.05 to 0.50 parts by weight and more preferably 0.08 to 0.30 parts by weight relative to 1.0 part by weight of the polyvinyl alcohol of the invention. At a crosslinking agent content within the above-defined range, the polyvinyl alcohol of the invention can be effectively cross-linked to prevent cracking or other defects.

When gelatin is used for the water-soluble resin, the following compounds other than the boron compounds may be used for the crosslinking agent.

Examples of such crosslinking agents include: aldehyde compounds such as formaldehyde, glyoxal and glutaraldehyde; ketone compounds such as diacetyl and cyclopentanedione; active halogen compounds such as bis(2-chloroethylurea)-2-hydroxy-4,6-dichloro-1,3,5-triazine and 2,4-dichloro-6-S-triazine sodium salt; active vinyl compounds such as divinyl sulfonic acid, 1,3-vinylsulfonyl-2-propanol, N,N'-ethylenebis(vinylsulfonylacetamide) and 1,3,5-triacryloyl-hexahydro-S-triazine; N-methylol compounds such as dimethylolurea and methylol dimethylhydantoin; melamine resins such as methylolmelamine and alkylated methylolmelamine; epoxy resins; isocyanate compounds such as 1,6-hexamethylene diisocyanate; aziridine compounds such as those described in U.S. Pat. No. 3,017,280 and U.S. Pat. No. 2,983,611; carboxyimide compounds such as those described in U.S. Pat. No. 3,100,704; epoxy compounds such as glycerol triglycidyl ether; ethyleneimino compounds such as 1,6-hexamethylene-N,N'-bisethylene urea; halogenated carboxyaldehyde compounds such as mucochloric acid and mucophenoxychloric acid; dioxane compounds such as 2,3-dihydroxydioxane; metal-containing compounds such as titanium lactate, aluminum sulfate, chromium alum, potassium alum, zirconyl acetate and chromium acetate; polyamine compounds such as tetraethylene pentamine; hydrazide compounds such as adipic acid dihydrazide; and low molecular compounds or polymers containing at least two oxazoline groups. These crosslinking agents may be used alone or in combination of two or more thereof.

<Water-Soluble Aluminum Compound>

The receptive layer 12 according to the invention contains a water-soluble aluminum compound. Use of a water-soluble aluminum compound is effective in improving the water resistance and ink-bleeding resistance over time of the formed conductive pattern. The sintering temperature of the conductive pattern can be reduced by using the aluminum hydroxide compound. This is presumably because, although the mechanism is not clear, the water-soluble aluminum oxide interacts with a dispersant of colloidal metal particles to make the adsorption of the dispersant onto the colloidal metal particles unbalanced whereby the dispersant separates from the particles.

Exemplary known water-soluble aluminum compounds include inorganic salts such as aluminum chloride or hydrates thereof, aluminum sulfate or hydrates thereof, and ammonium alum. Other examples include inorganic aluminum-containing cationic polymers such as basic polyaluminum hydroxide compounds. Among these, basic polyaluminum hydroxide compounds are preferable.

The basic polyaluminum hydroxide compounds are water-soluble polyaluminum hydroxide compounds containing in a stable manner polynuclear condensate ions of basic polymers, such as $[Al_6(OH)_{15}]^{3+}$, $[Al_8(OH)_{20}]^{4+}$, $[Al_{13}(OH)_{34}]^{5+}$, and $[Al_{21}(OH)_{60}]^{3+}$, and the major components thereof are represented by one of the following formulae 1, 2 and 3.

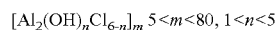

$[Al_2(OH)_nCl_{6-n}]_m$ $5<m<80$, $1<n<5$  Formula 1

$[Al(OH)_3]_nAlCl_3$ $1<n<2$  Formula 2

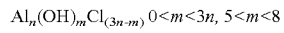

$Al_n(OH)_mCl_{(3n-m)}$ $0<m<3n$, $5<m<8$  Formula 3

These are placed on the market by Taki Chemical Co. Ltd. as a water treatment agent under the trade name of polyaluminum chloride (PAC), by Asada Kagaku Co. Ltd. under the trade name of polyaluminum hydroxide (Paho), by Rikengreen Co. Ltd. under the trade name of Pyurakem WT, by Taimei Chemicals Co. Ltd. under the trade name of Alfine 83, and also by other manufacturers for the same purpose, and compounds of various grades are readily available. In the invention, these commercially available products may be used without further treatment, but there are materials which have inappropriately low pH values and in these cases it is also possible to use the water-soluble aluminum compound having a suitably adjusted pH.

The content of the water-soluble aluminum compound in the receptive layer 12 according to the invention is preferably 0.1 to 20 wt %, more preferably 1 to 15 wt %, and most preferably 2 to 15 wt %, with respect to the total solids making up the receptive layer 12. A water-soluble aluminum compound content in the range of 2 to 15 wt % is effective in improving smoothness while achieving the effect of reducing the sintering temperature.

<Zirconium Compound>

The receptive layer 12 according to the invention contains a zirconium compound. Use of the zirconium compound allows improvement in water resistance.

The zirconium compound for use in the invention is not particularly limited, and various compounds may be used, and typical examples thereof include zirconyl acetate, zirconium chloride, zirconium oxychloride, zirconium hydroxychloride, zirconium nitrate, basic zirconium carbonate, zirconium hydroxide, zirconium ammonium carbonate, zirconium potassium carbonate, zirconium sulfate, and zirconium fluoride compound. Zirconyl acetate is particularly preferable.

The content of the zirconium compound in the receptive layer 12 according to the invention is preferably 0.05 to 5.0 wt %, more preferably 0.1 to 3.0 wt %, and most preferably 0.5 to 2.0 wt %, with respect to the total solids making up the receptive layer 12. A zirconium compound content in the range of 0.5 to 2.0 wt % allows improvement in water resistance without deterioration in ink (colloidal metal solution) solvent-absorbing property.

In the invention, a water-soluble polyvalent metal compound other than the water-soluble aluminum compound and the zirconium compound described above may be used in combination. Examples of the other water-soluble polyvalent metal compound include water-soluble salts of a metal selected from calcium, barium, manganese, copper, cobalt, nickel, iron, zinc, chromium, magnesium, tungsten, and molybdenum.

Typical examples thereof include calcium acetate, calcium chloride, calcium formate, calcium sulfate, barium acetate, barium sulfate, barium phosphate, manganese chloride, manganese acetate, manganese formate dihydrate, manganese ammonium sulfate hexahydrate, cupric chloride, ammonium copper (II) chloride dihydrate, copper sulfate, cobalt chloride, cobalt thiocyanate, cobalt sulfate, nickel sulfate hexahydrate, nickel chloride hexahydrate, nickel acetate tetrahydrate, nickel ammonium sulfate hexahydrate, nickel amidosulfate tetrahydrate, ferrous bromide, ferrous chloride, ferric chloride, ferrous sulfate, ferric sulfate, zinc bromide, zinc chloride, zinc nitrate hexahydrate, zinc sulfate, chromium acetate, chromium sulfate, magnesium sulfate, magnesium chloride hexahydrate, magnesium citrate nonahydrate, sodium phosphotungstate, sodium tungsten citrate, dodecatungstophosphoric acid n-hydrate, dodecatungstosilicic acid 26-hydrate, molybdenum chloride, and dodecamolybdophosphoric acid n-hydrate.

<Other Components>

The receptive layer 12 of the invention optionally contains the following components.

Examples of the ultraviolet absorbers include cinnamic acid derivatives, benzophenone derivatives and benzotriazolyl phenol derivatives. Specific examples include α-cyanophenyl cinnamic acid butyl ester, o-benzotriazole phenol, o-benzotriazole-p-chlorophenol, o-benzotriazole-2,4-di-t-butylphenol, and o-benzotriazole-2,4-di-t-octylphenol. A hindered phenol compound may also be used as an ultraviolet absorber, and phenol derivatives in which at least one of positions 2 and 6 is substituted by a branched alkyl group are preferable.

A benzotriazole based ultraviolet absorber, a salicylic acid based ultraviolet absorber, a cyanoacrylate based ultraviolet absorber, and oxalic acid, anilide based ultraviolet absorber or the like may also be used. For instance, these ultraviolet absorbers are described in JP 47-10537 A, JP 58-111942 A, JP 58-212844 A, JP 59-19945 A, JP 59-46646 A, JP 59-109055 A, JP 63-53544 A, JP 36-10466 B, JP 42-26187 B, JP 48-30492 B, JP 48-31255 B, JP 48-41572 B, JP 48-54965 B, JP 50-10726 B, U.S. Pat. No. 2,719,086, U.S. Pat. No. 3,707,375, U.S. Pat. No. 3,754,919 and U.S. Pat. No. 4,220,711.

A fluorescent whitening agent may also be used for the ultraviolet absorber, and specific examples include coumalin based fluorescent whitening agents. Specific examples are described in JP 45-4699 B and JP 54-5324 B.

Examples of the antioxidants are described in EP 223739 A, EP 309401 A, EP 309402 A, EP 310551 A, EP 310552 A, EP 459416 A, DE 3435443 A, JP 54-48535 A, JP 60-107384 A, JP 60-107383 A, JP 60-125470 A, JP 60-125471 A, JP 60-125472 A, JP 60-287485 A, JP 60-287486 A, JP 60-287487 A, JP 60-287488 A, JP 61-160287 A, JP 61-185483 A, JP 61-211079 A, JP 62-146678 A, JP 62-146680 A, JP 62-146679 A, JP 62-282885 A, JP 62-262047 A, JP 63-051174 A, JP 63-89877 A, JP 63-88380 A, JP 66-88381 A, JP 63-113536 A, JP 63-163351 A, JP 63-203372 A, JP 63-224989 A, JP 63-251282 A, JP 63-267594 A, JP 63-182484 A, JP 1-239282 A, JP 2-262654 A, JP 2-71262 A, JP 3-121449 A, JP 4-291685 A, JP 4-291684 A, JP 5-61166 A, JP 5-119449 A, JP 5-188687 A, JP 5-188686 A, JP 5-110490 A, JP 5-1108437 A, JP 5-170361 A, JP 48-43295 B, JP 48-33212 B, U.S. Pat. No. 4,814,262 and U.S. Pat. No. 4,980,275.

Specific examples of the antioxidants include 6-ethoxy-1-phenyl-2,2,4-trimethyl-1,2-dihydroquinoline, 6-ethoxy-1-octyl-2,2,4-trimethyl-1,2-dihydroquinoline, 6-ethoxy-1-phenyl-2,2,4-trimethyl-1,2,3,4-tetrahydroquinoline, 6-ethoxy-1-octyl-2,2,4-trimethyl-1,2,3,4,-tetrahydroquinoline, nickel cyclohexanoate, 2,2-bis(4-hydroxyphenyl)propane, 1,1-bis(4-hydroxyphenyl)-2-ethylhexane, 2-methyl-4-methoxy-diphenylamine, and 1-methyl-2-phenylindole.

These antioxidants may be used alone or in combination of two or more. The antioxidants may be dissolved in water, dispersed or emulsified, or they may be included within microcapsules. The amount of antioxidant added is preferably 0.01 to 10 wt % with respect to the receptive layer-forming liquid.

In the invention, the receptive layer 12 preferably contains an organic solvent with a high boiling point in order to prevent curling. The high boiling point organic solvent that may be used is preferably water-soluble, and examples of the water-soluble, high boiling point organic solvent include alcohols such as ethylene glycol, propylene glycol, diethylene glycol, triethylene glycol, glycerin, diethylene glycol monobutyl ether (DEGMBE), triethylene glycol monobutyl ether, glycerin monomethylether, 1,2,3-butanetriol, 1,2,4-butanetriol, 1,2,4-pentanetriol, 1,2,6-hexanetriol, thiodiglycol, triethanolamine, and polyethylene glycol (weight-average molecular weight of 400 or less). Diethylene glycol monobutyl ether (DEGMBE) is preferable.

The amount of high boiling point organic solvent in the receptive layer-forming liquid is preferably 0.05 to 1 wt %, and most preferably 0.1 to 0.6 wt %.

For the purpose of increasing the dispersability of the inorganic fine particles, inorganic salts, and acids or alkalis for the pH adjuster, may also be included.

Further, electronically conductive metal oxide fine particles and any of various matting agents may be included in order to suppress the generation of frictional charging and exfoliation charging on the surface and to reduce the surface friction, respectively, as long as the electric properties of the wiring board are not impaired.

The method of forming the receptive layer 12 using the material for the receptive layer is described below in further detail.

An example of the method of forming the receptive layer 12 according to the invention includes one having a step of preparing a dispersion by counter-colliding inorganic fine particles and a zirconium compound, or passing inorganic fine particles and a zirconium compound through an orifice, in a high-pressure disperser; a step of preparing a receptive layer-forming liquid by adding a cationic modified self-emulsifying polymer, a polyvinyl alcohol having a saponification value of 92 to 98 mol %, and a crosslinking agent to the dispersion; and a step of forming the receptive layer 12 by applying to the substrate 10 a coating liquid (functional liquid containing the receptive layer material) prepared by in-line mixing of a water-soluble aluminum compound into the receptive layer-forming liquid.

Another example of the method of forming the receptive layer 12 according to the invention includes one having a step of preparing a dispersion by counter-colliding inorganic fine particles, a zirconium compound and a crosslinking agent, or passing inorganic fine particles, a zirconium compound and a crosslinking agent through an orifice, in a high-pressure disperser; a step of preparing a receptive layer-forming liquid by adding a cationic modified self-emulsifying polymer and a polyvinyl alcohol having a saponification value of 92 to 98 mol % to the dispersion; and a step of forming the receptive layer 12 by applying to the substrate 10 a coating liquid (functional liquid containing the receptive layer material) prepared by in-line mixing of a water-soluble aluminum compound into the receptive layer-forming liquid.

According to the above-described forming method, the dispersion obtained by counter-colliding inorganic fine particles and a zirconium compound or inorganic fine particles, a zirconium compound and a crosslinking agent, or passing inorganic fine particles and a zirconium compound or inorganic fine particles, a zirconium compound and a crosslinking agent through an orifice, in a high-pressure disperser is advantageous in that it contains inorganic fine particles having a smaller particle size.

The mixture of inorganic fine particles and a zirconium compound or inorganic fine particles, a zirconium compound and a crosslinking agent is fed into a high-pressure disperser, in the state of a dispersion (preliminary dispersion) containing these components. Preliminary mixing (preliminary dispersion) may be performed by a common operation such as propeller agitating, turbine agitating, or homomixer agitating.

The high-pressure disperser that may be advantageously used in dispersion is a commercially available apparatus called high-pressure homogenizer.

Typical examples of the high-pressure homogenizer include Nanomizer (manufactured by Nanomizer Inc.), Microfluidizer (manufactured by Microfluidics Inc.), and Ultimizer (manufactured by Sugino Machine Ltd.).

The orifice is a mechanism in which the flow of liquid fed through a straight pipe is sharply restricted by a thin plate (orifice plate) having fine circular holes inserted therein.

The high-pressure homogenizer is an apparatus basically including a high pressure-generating unit for pressurizing, for example, raw material slurry and a counter-collision unit or orifice unit. Generally, a high-pressure pump called plunger pump is advantageously used for the high pressure-generating unit. Various types of high-pressure pumps, such as single pump, double pump, and triple pump may be used in the invention without particular limitation.

The process pressure in cases where the components of the receptive layer are counter-collided at high pressure is 50 MPa or more, preferably 100 MPa or more, and more preferably 130 MPa or more.

The difference between the pressures at the inlet and the outlet of the orifice through which the components of the receptive layer pass is 50 MPa or more, preferably 100 MPa or more, and more preferably 130 MPa or more, similarly to the process pressure.

The counter collision of the preliminary dispersion is preferably carried out at a relative collision speed of 50 m/s or more, more preferably 100 m/s or more, and even more preferably 150 m/s or more.

The linear velocity of a solvent passing through the orifice may vary according to the diameter of the orifice used, but is preferably 50 m/s or more, more preferably 100 m/s or more, and even more preferably 150 m/s or more, similarly to the collision speed during counter collision.

In any of the methods, the dispersion efficiency depends on the process pressure, and a higher process pressure results in higher dispersion efficiency. However, a process pressure of more than 350 MPa often causes problems in the pressure resistance of the piping of a high-pressure pump and the apparatus durability.

In any of the methods described above, the number of times the treatment is performed is not particularly limited, and usually selected as appropriate in the range of once to several tens of times. The dispersion can be prepared in this manner.

Various additives may be added in preparation of the dispersion.

Examples of the additives include various nonionic or cationic surfactants (anionic surfactants are undesirable because of aggregation), antifoams, nonionic hydrophilic polymers (polyvinyl alcohol, polyvinyl pyrrolidone, polyethylene oxide, polyacrylamide, various sugars, gelatin, pullulan, etc.), nonionic or cationic latex dispersions, water-miscible organic solvents (ethyl acetate, methanol, ethanol, isopropanol, n-propanol, acetone, etc.), inorganic salts, and pH adjusters, and these additives may be suitably used as needed.

In particular, water-miscible organic solvents are preferable because microaggregation of inorganic fine particles (silica) is prevented during preliminary dispersion. The water-miscible organic solvents are used in the dispersion in an amount of 0.1 to 20 wt %, and preferably 0.5 to 10 wt %.

The pH during preparation of the dispersion containing inorganic fine particles (vapor-phase process silica) may significantly vary with, for example, the kind of the inorganic fine particles (vapor-phase process silica) used and the various additives added, but is generally 1 to 8, and preferably 2 to 7. Two or more additives may be used in combination in the dispersion.

In the method of forming the receptive layer 12 according to the invention, the receptive layer-forming liquid is prepared by adding the cationic modified self-emulsifying polymer and the polyvinyl alcohol of the invention to the dispersion obtained by the method described above. The above-described dispersion, the cationic modified self-emulsifying polymer, the polyvinyl alcohol of the invention, and other components may be mixed, for example, by commonly used propeller agitation, turbine agitation, or homomixer agitation.

In the method of forming the receptive layer 12 according to the invention, examples of the in-line mixers that may be preferably used in in-line mixing of the water-soluble aluminum compound into the receptive layer-forming liquid include, but are not limited to, those described in, for example, JP 2002-85948A.

The method of forming the receptive layer 12 according to the invention may further include a step of crosslinking and curing the receptive layer 12 formed on a substrate by applying the coating liquid (functional liquid containing the receptive layer material) obtained by in-line mixing of a water-soluble aluminum compound into the receptive layer-forming liquid, by applying thereto a basic solution having a pH of 7.1 or more, either (1) simultaneously with application of the coating liquid (functional liquid containing the receptive layer material), or (2) before the receptive layer 12 exhibits a falling drying rate during drying of the receptive layer 12.

Presence of the receptive layer 12 thus cured by crosslinking is preferable in terms of colloidal metal solution solvent-absorbing property and prevention of film cracking.

In the method of forming the receptive layer 12 according to the invention, water, an organic solvent, or a mixed solvent thereof may be used as the solvent in each step. Examples of the organic solvent that may be used in coating include alcohols such as methanol, ethanol, n-propanol, i-propanol, and methoxypropanol, ketones such as acetone and methyl ethyl ketone, tetrahydrofuran, acetonitrile, ethyl acetate, and toluene.

The coating liquid (functional liquid containing the receptive layer material) can be applied by a known coating method using, for example, an extrusion die coater, an air doctor coater, a blade coater, a rod coater, a knife coater, a squeeze coater, a reverse roll coater, a bar coater or an ink-jet system.

The basic solution having a pH of 7.1 or more is applied to the receptive layer 12 simultaneously with application of the coating liquid (functional liquid containing the receptive layer material) or during drying of the receptive layer 12 formed by application of the coating liquid (functional liquid containing the receptive layer material) but before the receptive layer 12 exhibits a falling drying rate. Thus, the receptive layer 12 is advantageously produced by introducing the basic solution having a pH of 7.1 or more following application of the coating liquid (functional liquid containing the receptive layer material) within the period at which the receptive layer 12 exhibits a constant drying rate.

The basic solution having a pH of 7.1 or more may optionally contain a crosslinking agent. The basic solution having a pH of 7.1 or more is used as an alkaline solution to promote film curing, and preferably has a pH of 7.5 or more, and most preferably 7.9 or more. A pH which is too closer to the acidic side may result in insufficient crosslinking reaction of the polyvinyl alcohol contained in the coating liquid (functional liquid containing the receptive layer material) in the presence of the crosslinking agent, thus causing defects such as bronzing and cracking of the receptive layer 12.

The basic solution having a pH of 7.1 or more can be prepared, for example, by adding a metal compound (e.g., 1 to 5%) and a basic compound (e.g., 1 to 5%), and optionally p-toluenesulfonic acid (e.g., 0.5 to 3%) to ion-exchanged water and agitating the mixture thoroughly. In each composition, "%" means a solids weight %.

The phrase "before the receptive layer 12 exhibits a falling drying rate" generally means a period of a few minutes just after application of the coating liquid (functional liquid containing the receptive layer material), during which the receptive layer shows a phenomenon of "constant drying rate" wherein the content of the solvent (dispersion medium) in the receptive layer formed by application decreases linearly over time. The period of this "constant drying rate" is described, for example, in Chemical Engineering Handbook (pp. 707 to 712, published by Maruzen Co., Ltd., Oct. 25, 1980).

The receptive layer-forming liquid is generally dried after application at 40 to 180° C. for 0.5 to 10 minutes (preferably for 0.5 to 5 minutes) until the receptive layer 12 exhibits a falling drying rate as described above. The drying time varies with the amount of coating but it is generally suitable for the drying time to fall within the above-defined range.

Next, the colloidal metal solution making up the conductive metallic portions 14 is described below in detail.

The colloidal metal solution of the invention is not particularly limited as long as presence of the dispersant contributes to stabilization of the colloidal metal particles to provide a colloidal solution.

The colloidal metal particles contained in the colloidal metal solution are preferably obtained by reducing a metal compound in the presence of a polymer dispersant. The polymer dispersant enables the colloidal metal particles to be consistently kept in the state of a colloidal metal particle solution even at a high concentration. The metal concentration in the colloidal metal particles is preferably as high as possible, more preferably at least 93 wt %, and even more preferably at least 95 wt %.

The metal concentration in the colloidal metal particles refers to the weight percentage of a metal in the solids within the solution containing the colloidal metal particles. The solids content and the metal content can be determined by measuring the amount of solids remaining after heating at 140° C. and the amount of metal remaining after heating at 500° C., respectively. Specifically, the solids content is first determined using thermogravimetry-differential thermal analysis (TG-DTA) by heating the solution to 140° C. at a temperature rise rate of 10° C./min and keeping at 140° C. for 30 minutes. Then, the solution is heated again to 500° C. at a temperature rise rate of 10° C./min and kept at 500° C. for 30 minutes to determine the amount of metal. Unless otherwise specified, the metal concentration is measured in the present specification by using this method.

The metal compound as the starting material of the colloidal metal particles is dissolved in a solvent to generate metallic ions, which are reduced to deposit the colloidal metal particles. The metal which makes up the colloidal metal particles is not particularly limited but is preferably a noble metal or copper in order to obtain electrical conductivity. Examples of the noble metal include, but are not limited to, gold, silver, ruthenium, rhodium, palladium, osmium, iridium and platinum. Of these, gold, silver, platinum and palladium are preferred, and silver is particularly preferred in terms of excellent electrical conductivity.

The metal compound is not particularly limited as long as it contains any of the noble metals and copper, and examples thereof include tetrachloroauric (III) acid tetrahydrate (chlorauric acid), silver nitrate, silver acetate, silver (IV) perchlorate, hexachloroplatinic (IV) acid hexahydrate (chloroplatinic acid), potassium chloroplatinate, copper (II) chloride dihydrate, copper (II) acetate monohydrate, copper (II) sulfate, palladium (II) chloride dihydrate, and rhodium (III) trichloride trihydrate. These may be used singly or in combination of two or more.

The metal compound is preferably used so that the metal molar concentration in the solvent is at least 0.01 mol/L. A molar concentration of less than 0.01 mol/L is not efficient because the metal molar concentration in the resulting solution containing the colloidal metal particles is too low. The metal molar concentration is preferably at least 0.05 mol/L and more preferably at least 0.1 mol/L.

The solvent is not particularly limited as long as the metal compound can be dissolved therein, and examples thereof include water and organic solvents. Exemplary organic solvents that may be used include, but are not limited to, alcohols having 1 to 4 carbon atoms such as ethanol and ethylene glycol; ketones such as acetone; and esters such as ethyl acetate. These may be used singly or in combination of two or more. In cases where the solvent is a mixture of water with an organic solvent, a water-soluble organic solvent is preferably used and examples thereof include acetone, methanol, ethanol, and ethylene glycol. Water, an alcohol and a mixed solution of water and an alcohol are preferred because they are suitable to ultrafiltration carried out in the subsequent concentration step.

On the other hand, the polymer dispersant that may be preferably used is an amphiphatic copolymer which has a structure containing a solvated portion and in which a functional group having high affinity with the surfaces of the colloidal metal particles is introduced to a high molecular weight polymer.

Such polymer dispersant is usually used as a pigment dispersant during manufacture of a pigment past and generally has a number-average molecular weight of 1,000 to 1,000,000. At a number-average molecular weight of less than 1,000, the dispersion stability is not sufficient, whereas at a number-average molecular weight exceeding 1,000,000, handleability may often be difficult because of too high viscosity. The number-average molecular weight is more preferably 2,000 to 500,000 and even more preferably 4,000 to 500,000.

The polymer dispersant is not particularly limited as long as it has the above-described properties, and examples thereof include those illustrated in JP 11-80647 A. Various polymer dispersants may be used, and commercial products may also be used. Exemplary commercial products include Solsperse 20000, Solsperse 24000, Solsperse 26000, Solsperse 27000, Solsperse 28000 and Solsperse 41090 (available from Avecia); Disperbyk 160, Disperbyk 161, Disperbyk 162, Disperbyk 163, Disperbyk 166, Disperbyk 170, Disperbyk 180, Disperbyk 181, Disperbyk 182, Disperbyk 183, Disperbyk 184, Disperbyk 190, Disperbyk 191, Disperbyk 192, Disperbyk 2000, and Disperbyk 2001 (available from BYK Japan KK); Polymer 100, Polymer 120, Polymer 150, Polymer 400, Polymer 401, Polymer 402, Polymer 403, Polymer 450, Polymer 451, Polymer 452, Polymer 453, EFKA-46, EFKA-47, EFKA-48, EFKA-49, EFKA-1501, EFKA-1502, EFKA-4540, and EFKA-4550 (available from EFKA Chemical); Flowlen DOPA-158, Flowlen DOPA-22, Flowlen DOPA-17, Flowlen G-700, Flowlen TG-720W, Flowlen-730W, Flowlen-740W, and Flowlen-745W (available from Kyoeisha Chemical Co., Ltd.); AJISPER PA111, AJISPER PB711, AJISPER PB811, AJISPER PB821, and AJISPER PW911 (available from Ajinomoto Co., Inc.); and JONCRYL 678, JONCRYL 679, and JONCRYL 62 (available from Johnson Polymer). These may be used singly or in combination of two or more.

The polymer dispersant is preferably used in an amount of not more than 10 wt % with respect to the total amount of the metal in the metal compound and the polymer dispersant. At a polymer dispersant content in excess of 10 wt %, the concentration of the metal in the solids of the solution may often not be increased to a desired value when ultrafiltration is carried out later. The polymer dispersant content is more preferably not more than 8 wt % and even more preferably not more than 7 wt %.

The metal compound may be reduced by using a reducing compound. Amines are preferably used for the reducing compound, and for example metal ions are reduced to a metal at around room temperature by adding an amine to a solution containing the metal compound and the polymer dispersant and mixing with stirring. Use of such amine does not require use of a hazardous and harmful reducing agent and enables the metal compound to be reduced at a reaction temperature of about 5° C. to about 100° C. and preferably about 20° C. to about 80° C. without relying on heating or use of a special light irradiator.

Exemplary amines that may be used include, but are not limited to, those illustrated in JP 11-80647 A as exemplified by aliphatic amines such as propylamine, butylamine, hexylamine, diethylamine, dipropylamine, dimethylethylamine, diethylmethylamine, triethylamine, ethylenediamine, N,N,N',N'-tetramethylethylenediamine, 1,3-diaminopropane, N,N,N',N'-tetramethyl-1,3-diaminopropane, triethylenetetramine, and tetraethylenepentamine; alicyclic amines such as piperidine, N-methylpiperidine, piperazine, N,N'-dimethylpiperazine, pyrrolidine, N-methylpyrrolidine, and morpholine; aromatic amines such as aniline, N-methylaniline, N,N-dimethylaniline, toluidine, anisidine, and phenetidine; and aralkylamines such as benzylamine, N-methylbenzylamine, N,N-dimethylbenzylamine, phenethylamine, xylylenediamine, and N,N,N',N'-tetramethylxylylenediamine. Other exemplary amines include alkanolamines such as methylaminoethanol, dimethylaminoethanol, triethanolamine, ethanolamine, diethanolamine, methyldiethanolamine, propanolamine, 2-(3-aminopropylamino)ethanol, butanolamine, hexanolamine, and dimethylaminopropanol. These may be used singly or in combination of two or more. Of these, alkanolamine is preferred and dimethylaminoethanol is more preferred.

In addition to these amines, use may also be made of known reducing agents such as alkali metal borohydrides (e.g., sodium borohydride), hydrazine compounds, citric acid, tartaric acid, ascorbic acid, formic acid, formaldehyde, dithionites, and sulfoxylate derivatives. Citric acid, tartaric acid and ascorbic acid are preferred in terms of ease of availability. These may be used singly or in combination with the amines, but in cases where citric acid, tartaric acid and ascorbic acid are used in combination with the amines, citric acid, tartaric acid and ascorbic acid are preferably used in the form of salts. The reducing properties can be improved by using citric acid and sulfoxylate derivatives in combination with iron (II) ion.

The reducing compound is preferably added in at least an amount necessary to reduce the metal in the metal compound. At a smaller amount than necessary, reduction may be insufficient. Although the upper limit is not particularly defined, the reducing compound is preferably added in an amount of up to 30 times and more preferably up to 10 times as large as that necessary to reduce the metal in the metal compound. In addition to the method of chemical reduction by the addition of these reducing compounds, a method of light irradiation using a high-pressure mercury vapor lamp may also be used.

The method of adding the reducing compound is not particularly limited, and for example the reducing compound may be added after the addition of the polymer dispersion. In this case, for example, a solution is obtained by first dissolving the polymer dispersion in a solvent, then dissolving one of the reducing compound and the metal compound; to the resulting solution is added the other of the reducing compound and the metal compound to enable the reduction to proceed. Another method of adding the reducing compound may be applied in which the polymer dispersant and the reducing compound are first mixed and the resulting mixture is added to the solution of the metal compound.

A solution containing colloidal metal particles with an average particle size of about 5 nm to 100 nm is obtained by the reduction. This solution contains the colloidal metal particles and the polymer dispersant. In the present invention, the solution of the colloidal metal particles is defined as a solution in which fine metal particles are dispersed in a solvent and are noticeable as a solution. As described above, the metal concentration in the solution of the colloidal metal particles as obtained by the above-described production step may be determined by measurement using TG-DTA, but use may also be made of a value calculated by the amount of load used for charging in cases where measurement is not carried out.

Next, the solution following the reduction can be subjected to ultrafiltration. The solution of the colloidal metal particles following the reduction contains not only the colloidal metal particles and the polymer dispersant but also foreign ions such as chloride ion derived from the starting material, and impurities generated by the reduction such as salts and amines. These impurities may adversely affect the stability of the colloidal metal solution and are therefore desirably removed. The means of removal include electrodialysis, centrifugation and ultrafiltration, and particularly ultrafilatration can remove the impurities while simultaneously concentrating by removal of part of the polymer dispersant, thus increasing the metal concentration.

The solids content of the colloidal metal particles and the polymer dispersant contained in the colloidal metal solution to be subjected to ultrafiltration is preferably 0.05 to 50% on a weight basis. At a solids content of less than 0.05%, efficient ultrafiltration is not possible due to a too low metal molar concentration, whereas it may often be difficult to remove the impurities at a solids content in excess of 50%.

Substances separated by ultrafiltration usually have a diameter of 1 nm to 5 μm. By setting the diameter as above, the impurities and part of the polymer dispersant can be removed to increase the metal concentration in the resulting colloidal metal particles. At a diameter of less than 1 nm, unwanted components such as the impurities often do not pass through the filter membrane and cannot be removed, whereas at a diameter exceeding 5 μm, most of the colloidal metal particles often pass through the filter membrane, making it impossible to obtain the colloidal metal particles at a high concentration.

Examples of the filter membrane that may be usually used for ultrafiltration include, but are not limited to, those made of resins such as polyacrylonitriles, vinyl chloride/acrylonitrile copolymers, polysulfones, polyimides, and polyamides. Of these, polyacrylonitriles and polysulfones are preferred and polyacrylonitriles are more preferred. In terms of efficient cleaning of the filter membrane usually carried out after the end of ultrafiltration, a filter membrane capable of reverse cleaning is preferably used for ultrafiltration.

The filter membrane for use in ultrafiltration preferably has a molecular weight cut-off of 3,000 to 80,000. Unwanted substances such as the polymer dispersant are not fully removed with ease at a molecular weight cut-off of less than 3,000, whereas such substances easily pass through the filter membrane and desired colloidal metal particles may often not be obtained at a molecular weight cut-off exceeding 80,000. The molecular weight cut-off is more preferably 10,000 to 60,000. The molecular weight cut-off generally refers to a molecular weight of a polymer which is excluded outside after passing through the pores in the ultrafiltration membrane when a polymer solution is flowed through the ultrafiltration membrane, and is used to evaluate the pore diameter of the filter membrane. The filter membrane has a larger pore diameter with a larger molecular weight cut-off.

Ultrafiltration is not particularly limited for the filtration module type and is classified depending on the type of the filter membrane into, for example, a hollow fiber module (also called capillary module), spiral module, tubular module and plate module. Any of them may be advantageously used in the invention. Of these, a hollow fiber module which has a large filtration area and a compact form is preferred in terms of efficiency. In cases where the solution containing the colloidal metal particles is used for treatment in a large amount, it is preferred to use an ultrafilter having a large number of membranes.

The method of ultrafiltration is not particularly limited and a method known in the art may be used to pass through the ultrafiltration membrane the solution of the colloidal metal particles obtained by reducing the metal compound. In this way, the filtrate containing the impurities and the polymer dispersant is excluded. Ultrafiltration is usually repeated until the foreign ions of the filtrate are removed to a desired concentration or less. In this process, it is preferred to add the solvent in the same amount as the amount of the filtrate removed for making constant the concentration of the solution of the colloidal metal particles treated. The solvent of the solution of the colloidal metal particles can be substituted by adding a different type of solvent from the solvent used in reduction.

Ultrafiltration may be carried out by a usual operation, for example, a so-called batch system. The batch system is a system in which the solution of the colloidal metal particles to be treated is added with proceeding ultrafiltration. It is also possible to further perform ultrafiltration after the foreign ions have been removed to a desired concentration or less in order to increase the solids concentration.

The thus obtained solution containing the colloidal metal particles is adjusted to a form suitable for the ink-jet system, yielding the colloidal metal solution. Water-soluble resins such as glycerol, maltitol, and carboxymethyl cellulose, ethylene glycol, surfactants, pH adjusters, chelating agents, binders, surface tension adjusters and plasticizers are usually added in order to adjust the viscosity, to improve the dispersibility and permeability of the receptive layer 12 and to prevent nozzle drying. Fungicides, preservatives, humectants, evaporation accelerators, antiforming agents, antioxidants, light stabilizers, deterioration preventing agents, oxygen absorbents and anticorrosives may also be optionally added.

The metal content in the colloidal metal solution, the contents of the components used for the above adjustment, and the viscosity can be set to 2 to 50 wt %, 0.3 to 30 wt % and 3 to 30 cP, respectively.

The illustrated colloidal metal solution is an example obtained by liquid-phase reduction, but the present invention is not limited to this and a colloidal metal solution produced by a so-called vapor-phase process may be used. For example, a solution which is commercially available from Harima Chemicals, Inc. under the trade name of NPS-J may be used with advantage.

The present invention is basically as described above.

While the method of forming a wiring board of the invention has been described above in detail, the invention is by no means limited to the foregoing embodiments and it should be understood that various improvements and modifications are possible without departing from the scope and spirit of the invention.

EXAMPLES

On the following pages, specific examples of the invention are given to explain the invention in greater detail.

It should be noted that the materials, amounts of use, proportions, treatments, treatment procedures, and other information that are given in the following Examples can be altered as appropriate unless departure from the scope and spirit of the invention is made. Therefore, the scope of the invention should not be construed as being limited by the following specific examples.

The wiring boards were prepared by the method described below and their evaluation was carried out.

Example 1

Colloidal silver ink (NPS-J available from Harima Chemicals, Inc.) was first filled into a head of a piezoelectric ink-jet recording apparatus (DMP-2831 available from FUJIFILM Corporation) and ejected for drawing on paper exclusively used for ink-jet printing (Gasai available from FUJIFILM Corporation) and serving as a substrate having a receptive layer formed thereon in accordance with image data of a conductive (wiring) pattern, and the substrate having the pattern drawing was allowed to stand at room temperature for 7 days to be dried.

Then, a water repellent (CYTOP CTX-100 available from Asahi Glass Co., Ltd.) was diluted with a solvent (CT-Solv.100 available from Asahi Glass Co., Ltd.) to a concentration of 3%. The diluted solution was filled into the head of the piezoelectric ink-jet recording apparatus (DMP-2831 available from FUJIFILM Corporation) and applied to part of the receptive layer on which the conductive (wiring) pattern was not drawn. The applied solution was cured in a hot air furnace at 120° C. for 1 hour for preventing migration to thereby prepare a wiring board in Example 1.

The conductive pattern (drawing pattern) was formed so as to have a comb-like pattern with a ratio of the conductor width to the conductor to conductor spacing (L/S) of 100 μm/100 μm.

Comparative Example 1

Colloidal silver ink (NPS-J available from Harima Chemicals, Inc.) was filled into the head of the piezoelectric ink-jet recording apparatus (DMP-2831 available from FUJIFILM Corporation) and ejected for drawing on paper exclusively used for ink-jet printing (Gasai available from FUJIFILM Corporation) and serving as a substrate having a receptive layer formed thereon in accordance with image data of a conductive (wiring) pattern, and the substrate having the pattern drawing was dried at 120° C. for 1 hour without migration-proof treatment to prepare a wiring board in Comparative Example 1.

The conductive pattern (drawing pattern) was formed so as to have a comb-like pattern with a ratio of the conductor width to the conductor to conductor spacing (L/S) of 100 μm/100 μm.

Reference Example 1

Colloidal silver ink (NPS-J available from Harima Chemicals, Inc.) was filled into the head of the piezoelectric ink-jet recording apparatus (DMP-2831 available from FUJIFILM Corporation) and ejected for drawing on a kapton film (EN available from DuPont-Toray Co., Ltd.) serving as a substrate having no receptive layer in accordance with image data of a conductive (wiring) pattern, then sintering at 220° C. for 1 hour was carried out to prepare a wiring board in Reference Example 1.

The conductive pattern (drawing pattern) was formed so as to have a comb-like pattern with a ratio of the conductor width to the conductor to conductor spacing (L/S) of 100 μm/100 μm.

The methods of forming the respective wiring boards in Example 1, Comparative Example 1 and Reference Example 1 were summarized in Table 1.

TABLE 1

| | Substrate | Receptive layer | Application of migration-proof solution | Sintering for drying |
|---|---|---|---|---|
| Example 1 | IJ exclusive paper | Formed | Applied at 120° C. for 1 hour | Not sintered |
| Comparative Example 1 | IJ exclusive paper | Formed | Not applied | 120° C., 1 hour |
| Reference Example 1 | PI film | Not formed | Not applied | 220° C., 1 hour |

Paper exclusively used for ink-jet (IJ) printing: exclusive paper for ink-jet printing "Gasai" available from FUJIFILM Corporation;
Polyimide (PI) film: kapton film "EN" available from DuPont-Toray Co., Ltd.;
Colloidal metal solution: NPS-J available from Harima Chemicals, Inc.;
Migration-proof solution: diluted solution of CYTOP available from Asahi Glass Co., Ltd.

[Measurement of Resistivity and Evaluation of Migration Resistance]

Each wiring board prepared in Example 1, Comparative Example 1 and Reference Example 1 was measured for the film thickness by a stylus surface profiler (Dektak III available from ULVAC, Inc.) and for the sheet resistance by a low resistivity meter (Loresta GP available from Mitsubishi Chemical Corporation). The measured film thickness was used to calculate the volume resistivity. The volume resistivity depends on the application of the wiring used but the wiring board can be fully used in any application as long as the volume resistivity has a value of the order of $10^{-5}$ or less. The results are shown in Table 2.

TABLE 2

| | Film thickness (μm) | Sheet resistance (Ω/sq) | Volume resistivity (Ω·cm) |
|---|---|---|---|
| Example 1 | 2.4 | 2.0E−01 | 5.1E−05 |
| Comparative Example 1 | 2.4 | 2.1E−01 | 5.1E−05 |
| Reference Example 1 | 0.49 | 1.2E−01 | 6.2E−06 |

The migration resistance was evaluated by the method described below.

Figure 7:
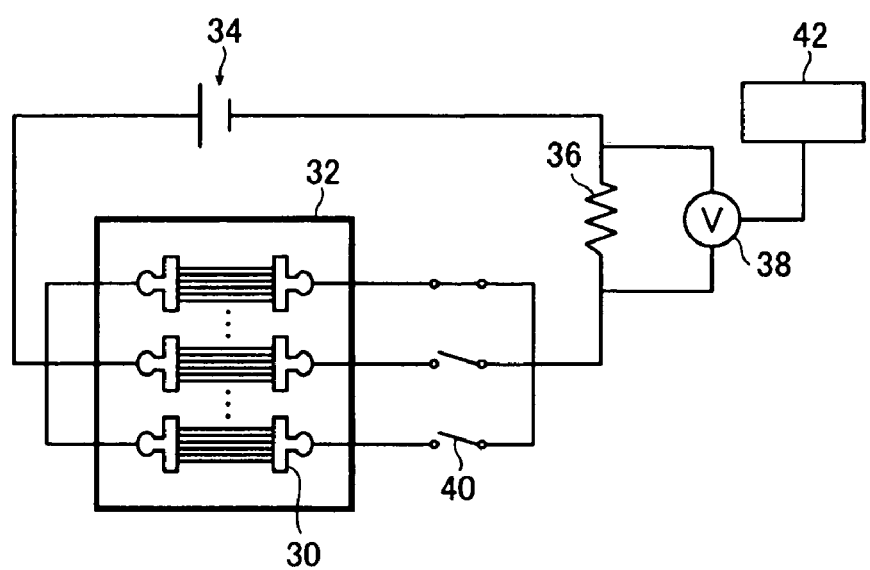
FIG. 7 is a diagram showing a migration resistance tester.
Figure 8A:
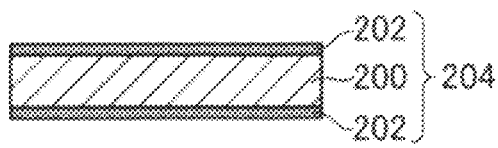
FIGS. 8A to 8F are cross-sectional views showing in steps a wiring pattern forming method using the subtractive process.
Figure 8B:
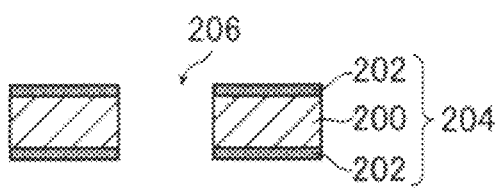
Figure 8C:
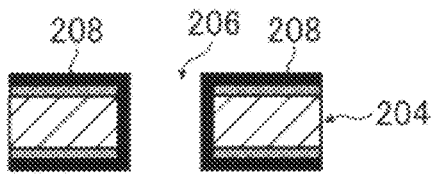
Figure 8D:
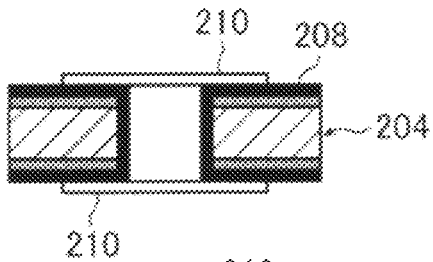
Figure 8E:
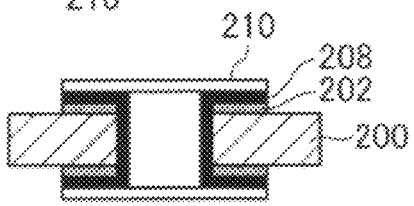
Figure 8F:
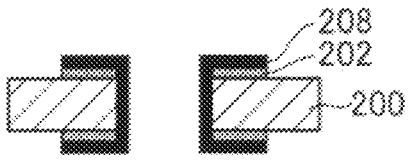
Figure 9A:
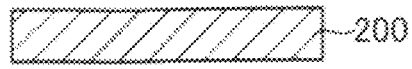
FIGS. 9A to 9G are cross-sectional views showing in steps a wiring pattern forming method using the semi-additive process.
Figure 9B:
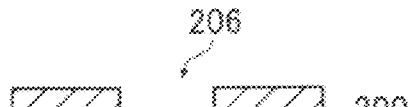
Figure 9C:
Figure 9D:
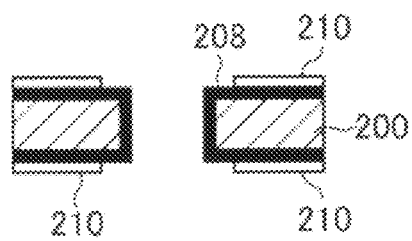
Figure 9E:
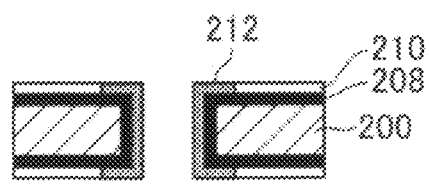
Figure 9F:
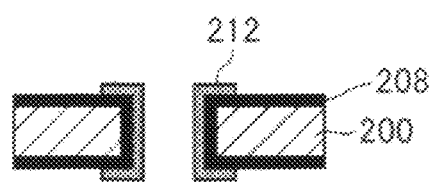
Figure 9G:
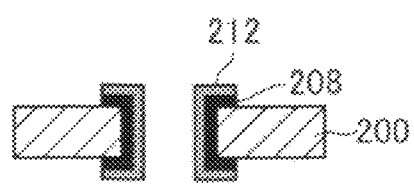
Figure 10A:
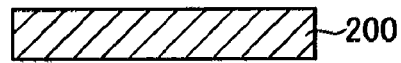
FIGS. 10A to 10E are cross-sectional views showing in steps a wiring pattern forming method using the additive process.
Figure 10B:
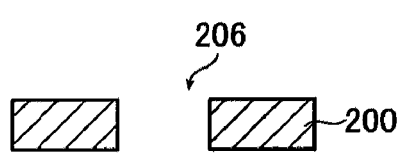
Figure 10C:
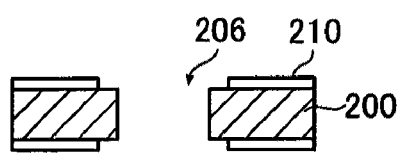
Figure 10D:
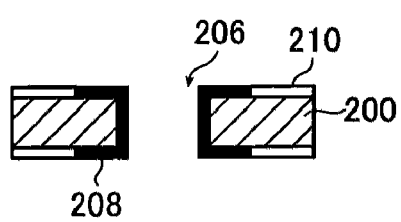
Figure 10E:
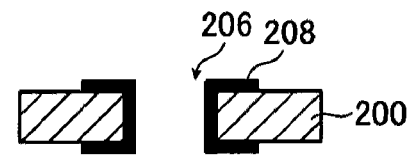

As shown in FIG. 7, the respective wiring boards 30 prepared were set in a constant temperature and humidity bath (LHU-113 available from Tabai Espec Corp.) 32 and an external power supply 34 was connected in parallel and a resistor 36 of 100 kΩ in series with the wiring boards 30. Then, switches 40 were operated to measure the potential difference between both sides of the resistor 36 by a digital multimeter 38 and monitor it on a computer 42. The measurement conditions were as follows: the constant temperature and humidity bath 32 had a temperature of 60° C. and a humidity of 90% RH; voltage applied: 25 V. Based on the evaluation criteria, a wiring board was determined to be defective at the point in time when the insulation resistance became less than 1 MΩ.

The results are shown in Table 3.

TABLE 3

| | Migration | | | |
|---|---|---|---|---|
| | Time at which migration occurred (h) | Growth direction | Type | Layer where migration occurred |
| Example 1 | >400 | | No migration occurred | |
| Comparative Example 1 | Wiring board reached environmental conditions of 60° C./90% RH and short-circuited just after start of current application | Cathode → anode | Dendrite migration occurred | Receptive layer |
| Reference Example 1 | >400 | Cathode → anode | Dendrite migration occurred | Substrate surface |

The results of Table 2 confirmed that Example 1 and Comparative Example 1 where wiring was formed using a substrate having a receptive layer formed thereon achieves low resistance, that is, high conductivity even by sintering at low temperatures.

Therefore, it was confirmed that, even if sintering is not performed at high temperatures, the wiring board in Example 1 has conductivity which is substantially at the same level as in the commonly used wiring board in Reference Example 1.

As the results in Table 3 show, the insulation resistance did not decrease for more than 400 hours in the wiring board in Example 1 in which the migration-proof solution was applied. On the other hand, the wiring board in Comparative Example 1 in which the migration-proof solution was not applied reached the environmental conditions of 60° C. and 90% RH and short-circuited just after the start of current application. Dendrite migration occurred at the receptive layer from the cathode side to the anode side.

After the elapse of 400 hours or more, dendrite migration occurred in the commonly used wiring board in Reference Example 1 in which no receptive layer was formed and the migration-proof solution was not applied. Therefore, it was confirmed that the wiring board in Example 1 has migration resistance which is equal to or higher than that of the commonly used wiring board in Reference Example 1.

Example 2

Preparation of Receptive Layer-Forming Liquid

According to the composition of the silica dispersion, to a solution obtained by mixing ion-exchanged water, 7.5% boric acid solution, and a dimethyldiallylammonium chloride polymer (dispersant Shallol DC902P available from Dai-Ichi Kogyo Seiyaku; 51.5% solution), silica fine particles (AEROSIL 300SF75 available from Nippon Aerosil Co., Ltd.), then zirconyl acetate (Zircosol ZA-30 available from Daiichi Kigenso Kagaku Kogyo Co., Ltd.; 50% solution) were added to obtain a slurry, which was then dispersed at 170 MPa in Ultimizer manufactured by Sugino Machine Ltd. to obtain a silica dispersion containing particles having a median diameter (average particle diameter) of 120 nm.

Ion-exchanged water, a 7.5% boric acid solution, a dimethylamine-epichlorohydrin-polyalkylene polyamine polycondensate (SC-505 available from Hymo Co., Ltd.; 50% solution), a polyvinyl alcohol solution, and a cationic modified polyurethane (SUPERFLEX 650-5 available from Daiichi Kogyo Seiyaku Co., Ltd.; 25% solution) were sequentially added to the silica dispersion according to the following composition for a receptive layer-forming liquid, to prepare the receptive layer-forming liquid.

<Composition of Silica Dispersion>
(1) Vapor-phase process silica fine particles 15.0 parts
(2) Ion-exchanged water 78.5 parts
(3) 7.5% Boric acid solution (crosslinking agent) 4.4 parts
(4) Dimethyldiallylammonium chloride polymer 1.31 parts
(5) Zirconyl acetate 0.81 part
<Composition of Receptive Layer-Forming Liquid>
(1) Silica dispersion 59.5 parts
(2) Ion-exchanged water 12.2 parts
(3) Dimethylamine-epichlorohydrin-polyalkylene polyamine polycondensate (50% solution) 0.1 part
(4) Polyvinyl alcohol solution described below 26.0 parts
(5) Cationic modified polyurethane 2.2 parts
<Composition of Polyvinyl Alcohol Solution>
(1) Polyvinyl alcohol 6.96 parts
(JM-33 available from Japan VAM & POVAL Co., Ltd., saponification value: 94.3 mol %, polymerization degree: 3,300)
(2) Polyoxyethylene lauryl ether 0.23 part
(surfactant, Emulgen 109P available from Kao Corp.)
(3) Diethylene glycol monobutyl ether 2.12 parts
(Butycenol 20P available from Kyowa Hakko Chemical Co., Ltd.)
(4) Ion-exchanged water 90.69 parts
<Preparation of Receptive Layer-Bearing Substrate>

A PAC 1 solution having the composition indicated below was prepared and in-line blended with 183 g/m$^2$ of the receptive layer-forming liquid so as to have a coating weight of 11.4 g/m$^2$. The resulting blend was applied to a quartz glass substrate by an extrusion die coater. The substrate was then dried in a hot air dryer at 80° C. (at an air velocity of 3 to 8 m/s) until the receptive layer had a solids concentration of 20%. The receptive layer showed a constant drying rate during this period. The receptive layer was immersed in a basic solution (pH: 7.8) having the composition indicated below for 3 seconds before it showed a falling drying rate, to deposit the solution on the receptive layer in an amount of 13 g/m$^2$, and the deposited film was dried at 65° C. for 10 minutes (curing step). A receptive layer-bearing substrate having a receptive layer with a dried film thickness of 32 μm was thus prepared.

<Composition of PAC 1 Solution>
(1) Aqueous polyaluminum chloride solution at a basicity of 83% (Alfine 83 available from Taimei Chemicals Co., Ltd.) 20 parts
(2) Ion-exchanged water 80 parts
<Composition of Basic Solution>
(1) Boric acid 0.65 part
(2) Zirconium ammonium carbonate (28% aqueous solution) 0.33 part
(Zircosol AC-7 available from Daiichi Kigenso Kagaku Kogyo Co., Ltd.)
(3) Ammonium carbonate (reagent grade) 3.5 parts
(available from Kanto Kagaku Co. Inc.)
(4) Ion-exchanged water 63.3 parts
(5) Polyoxyethylene lauryl ether (2% aqueous solution) 30.0 parts
(surfactant, Emulgen 109P available from Kao Corp.)

Colloidal silver ink (NPS-J available from Harima Chemicals, Inc.) was then filled into the head of the piezoelectric ink-jet recording apparatus (DMP-2831 available from FUJI- FILM Corporation) and ejected for drawing on a receptive layer-bearing substrate formed thereon as prepared by the above-described method in accordance with image data of a conductive (wiring) pattern, and the substrate having the pattern drawing was allowed to stand at room temperature for 7 days to be dried.

Then, a water repellent (CYTOP CTX-100 available from Asahi Glass Co., Ltd.) was diluted with a solvent (CT-Solv.100 available from Asahi Glass Co., Ltd.) to a concentration of 3%. The diluted solution was filled into the head of the piezoelectric ink-jet recording apparatus (DMP-2831 available from FUJIFILM Corporation) and applied to part of the receptive layer on which the conductive (wiring) pattern was not drawn. The applied solution was cured in a hot air furnace at 120° C. for 1 hour for preventing migration to thereby prepare a wiring board in Example 2.

The conductive pattern (drawing pattern) was formed so as to have a comb-like pattern with a ratio of the conductor width to the conductor to conductor spacing (L/S) of 100 μm/100 μm.

<Measurement of Resistivity and Evaluation of Migration Resistance>

The wiring board prepared by the above-described method was subjected to resistivity measurement and evaluation of the migration resistance in the same manner as above.

The results of the resistivity measurement are as follows: film thickness: 2.4 μm; sheet resistance: 2.1E-1 Ω/sq; and volume resistivity: 5.1E-5 Ω·cm.

As for the evaluation of the migration resistance, insulation resistance did not decrease for 400 hours or more, causing no migration.

What is claimed is:

1. A method of forming a wiring board comprising:
a step of forming a receptive layer having a porous structure on a substrate;
a step of forming wiring portions in a desired conductive pattern on a surface of the receptive layer by ejecting a colloidal metal solution for drawing by an ink-jet system; and
a step of performing a migration-proof treatment on at least part of the receptive layer exposed between mutually adjacent wiring portions,
wherein the receptive layer is formed only at portions where the conductive pattern is to be formed by ejecting a functional liquid containing a receptive layer-forming material on the substrate by the ink-jet system.

2. A method of forming a wiring board comprising:
a step of forming a receptive layer having a porous structure on a substrate;
a step of forming wiring portions in a desired conductive pattern on a surface of the receptive layer by ejecting a colloidal metal solution for drawing by an ink-jet system; and
a step of performing a migration-proof treatment on at least part of the receptive layer exposed between mutually adjacent wiring portions,
wherein the migration-proof treatment is a treatment which includes applying an insulating resin after drying the colloidal metal solution for forming the wiring portions onto the part of the receptive layer situated between the mutually adjacent wiring portions to impregnate the receptive layer with the insulating resin, and curing the insulating resin to form cured portions in the receptive layer.

3. The method according to claim 2, wherein the cured portions are formed in the part of the receptive layer situated between the mutually adjacent wiring portions and have a height which is equal to a height of the receptive layer.

4. The method according to claim 2, wherein the curing of the insulating resin is performed by one of thermal polymerization and photopolymerization.

5. The method according to claim 2, wherein the insulating resin is at least one resin selected from the group consisting of polysilane compounds, acrylic resins, polyimide resins, olefin resins, phenolic resins, melamine resins and epoxy resins.

6. A method of forming a wiring board comprising:
a step of forming a receptive layer having a porous structure on a substrate;
a step of forming wiring portions in a desired conductive pattern on a surface of the receptive layer by ejecting a colloidal metal solution for drawing by an ink-jet system; and
a step of performing a migration-proof treatment on at least part of the receptive layer exposed between mutually adjacent wiring portions,
wherein the migration-proof treatment is a treatment which includes applying a water repellent onto the part of the receptive layer situated between the mutually adjacent wiring portions with the ink-jet system to form a water-repellent treatment portion.

7. The method according to claim 6, wherein the water repellent is at least one selected from the group consisting of polytetrafluoroethylene (PTFE), ethylene-tetrafluoroethylene copolymer, hexafluoropropylene-tetrafluoroethylene copolymer, polyvinylidene fluoride, ethylene having a long-chain perfluoroalkyl structure, acrylate, methacrylate, vinyl, urethane, and silicone polymer.

8. The method according to claim 1, wherein the migration-proof treatment is performed after the colloidal metal solution for forming the wiring portions has dried.

9. A method of forming a wiring board comprising:
a step of forming a receptive layer having a porous structure on a substrate;
a step of forming wiring portions in a desired conductive pattern on a surface of the receptive layer by ejecting a colloidal silver solution for drawing by an ink-jet system; and
a step of applying a water repellent on a surface of the wiring portions made of silver with the ink-jet system for preventing migration,
wherein the water repellent comprises a fluoroalkylamine.

10. The method according to claim 1, wherein the receptive layer is a porous receptive layer comprising a self-emulsifying polymer, inorganic fine particles, a polyvinyl alcohol having a saponification value of 92 to 98 mol %, a water-soluble aluminum compound, a zirconium compound, and a crosslinking agent.

11. A wiring board formed by the method according to claim 1.

12. The wiring board according to claim 11 which is used as an electromagnetic interference shielding film for plasma display panels.

* * * * *